United States Patent
Kim

(10) Patent No.: US 10,692,582 B2
(45) Date of Patent: Jun. 23, 2020

(54) SEMICONDUCTOR MEMORY DEVICE AND METHOD OF OPERATING THE SAME

(71) Applicant: Samsung Electronics Co., Ltd., Suwon-si, Gyeonggi-do (KR)

(72) Inventor: Kyung-Ryun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/130,544

(22) Filed: Sep. 13, 2018

(65) Prior Publication Data
US 2019/0164621 A1   May 30, 2019

(30) Foreign Application Priority Data
Nov. 24, 2017  (KR) .................. 10-2017-0158829

(51) Int. Cl.
*G11C 29/18*   (2006.01)
*G11C 29/00*   (2006.01)
*G11C 29/44*   (2006.01)

(52) U.S. Cl.
CPC .............. *G11C 29/18* (2013.01); *G11C 29/44* (2013.01); *G11C 29/785* (2013.01); *G11C 29/806* (2013.01)

(58) Field of Classification Search
CPC ....... G11C 29/18; G11C 29/44; G11C 29/785; G11C 29/806
USPC ....................................................... 365/200
See application file for complete search history.

(56) References Cited

U.S. PATENT DOCUMENTS

| 5,033,024 A * | 7/1991 | O'Connell ........... G11C 29/846 365/200 |
| 5,838,623 A | 11/1998 | Pascucci |
| 6,118,712 A | 9/2000 | Park et al. |
| 6,480,429 B2 | 11/2002 | Jones et al. |
| 7,006,393 B2 | 2/2006 | Merritt et al. |
| 7,679,133 B2 | 3/2010 | Son et al. |
| 8,324,958 B2 | 12/2012 | Lee |

(Continued)

FOREIGN PATENT DOCUMENTS

| KR | 1999-0015310 | 3/1999 |
| KR | 10-2005-0037144 | 4/2005 |

(Continued)

OTHER PUBLICATIONS

Search Report issued by the Intellectual Property Office of Singapore dated Jul. 7, 2019 for IPOS Application No. 10201808905V.

*Primary Examiner* — Fernando Hidalgo
(74) *Attorney, Agent, or Firm* — Harness, Dickey and Pierce, P.L.C.

(57) ABSTRACT

A semiconductor memory device a memory cell array and a repair control circuit. The memory cell array including a normal cell region and a redundancy cell region, the normal cell region including a plurality of normal region groups, and redundancy cell region configured to replace failed memory cells of the normal cell region. The repair control circuit configured to, determine a target normal region group from among the plurality of normal region groups based on an input address, extract target fail addresses from among a plurality of fail addresses based on the target normal region group, and control a repair operation based on the target fail addresses and the input address.

19 Claims, 20 Drawing Sheets

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 9,007,856 B2 | 4/2015 | Son et al. |
| 9,552,868 B2 | 1/2017 | You et al. |
| 2001/0023093 A1 | 9/2001 | Do et al. |
| 2005/0007843 A1 | 1/2005 | Choi et al. |
| 2011/0051538 A1 | 3/2011 | Lunde et al. |
| 2011/0233648 A1 | 9/2011 | Seol et al. |
| 2017/0229191 A1* | 8/2017 | Ouellette ............... G11C 29/44 |
| 2019/0035487 A1* | 1/2019 | Shih ..................... G11C 29/808 |
| 2019/0066819 A1* | 2/2019 | Lovett ................... G11C 29/44 |

FOREIGN PATENT DOCUMENTS

| | | |
|---|---|---|
| KR | 10-1124320 B1 | 3/2012 |
| KR | 10-2014-0065320 | 5/2014 |
| KR | 10-2016-0105599 | 2/2015 |

\* cited by examiner

SEMICONDUCTOR MEMORY DEVICE AND METHOD OF OPERATING THE SAME

CROSS-REFERENCE TO RELATED APPLICATION

This U.S. Non-provisional application claims priority under 35 USC § 119 to Korean Patent Application No. 10-2017-0158829, filed on Nov. 24, 2017, in the Korean Intellectual Property Office (KIPO), the disclosure of which is incorporated by reference in its entirety herein.

BACKGROUND

1. Technical Field

Example embodiments relate generally to semiconductor integrated circuits. For example, at least some example embodiments relate to a semiconductor memory device and/or a method of operating a semiconductor memory device for efficient repair operation.

2. Discussion of the Related Art

Semiconductor memory devices may be divided into nonvolatile memory devices such as a flash memory and volatile memory devices such as a dynamic random access memory (DRAM). The flash memory may be used as a storage to store massive data and DRAM may be used as a main memory to store system data. Recently a manufacturing scale of the semiconductor memory device is being decreased to increase a degree of integration, and accordingly, a bit error rate may increase and yield may decrease. To secure a certain degree of yield, a repair scheme using redundancy resources may be used. However, a size of the semiconductor memory device may increase to implement the repair scheme.

SUMMARY

Some example embodiments may provide a semiconductor memory device and/or a method of operating a semiconductor memory device capable of efficiently performing a repair operation.

Some example embodiments relate to a semiconductor memory device including a memory cell array including a normal cell region and a redundancy cell region, the normal cell region including a plurality of normal region groups, and redundancy cell region configured to replace failed memory cells of the normal cell region; and a repair control circuit configured to, determine a target normal region group from among the plurality of normal region groups based on an input address, extract target fail addresses from among a plurality of fail addresses based on the target normal region group, and control a repair operation based on the target fail addresses and the input address.

Some example embodiments relate to a semiconductor memory device including a normal cell region including a plurality of normal region groups, each of the normal region groups including a plurality of sub regions, the plurality of sub regions included in respective ones of the normal region groups arranged one by one sequentially in a column direction according to a round-robin scheme; a redundancy cell region configured to replace failed memory cells of the normal cell region; and a repair control circuit configured to, determine a target normal region group from among the plurality of normal region groups based on an input address, extract target fail addresses from among a plurality of fail addresses based on the target normal region group, and control a repair operation based on the target fail addresses and the input address.

Some example embodiments relate to a method of operating a semiconductor memory device, where the semiconductor memory device includes a normal cell region and a redundancy cell region, the normal cell region divided into a plurality of normal region groups, and the redundancy cell region configured to replace failed memory cells of the normal cell region. In some example embodiments, the method includes determining a target normal region group from among the plurality of normal region groups based on an input address; extracting target fail addresses from among a plurality of fail addresses based on the target normal region group; and controlling a repair operation based on the target fail addresses and the input address.

The semiconductor memory device and the method of operating the semiconductor memory device according to example embodiments may reduce a size of the semiconductor memory device by grouping the normal cell region into the plurality of normal region groups to reduce the number of the comparators and the bit number of the fail addresses that are stored and compared.

In addition, the semiconductor memory device and the method of operating the semiconductor memory device according to example embodiments may increase yield of the semiconductor memory device without increase of a size of the semiconductor memory device by dividing each normal region group into a plurality of the sub blocks and disposing the adjacent sub regions in the different normal region groups.

BRIEF DESCRIPTION OF THE DRAWINGS

Example embodiments of the present disclosure will be more clearly understood from the following detailed description taken in conjunction with the accompanying drawings.

DETAILED DESCRIPTION

Figure 1:
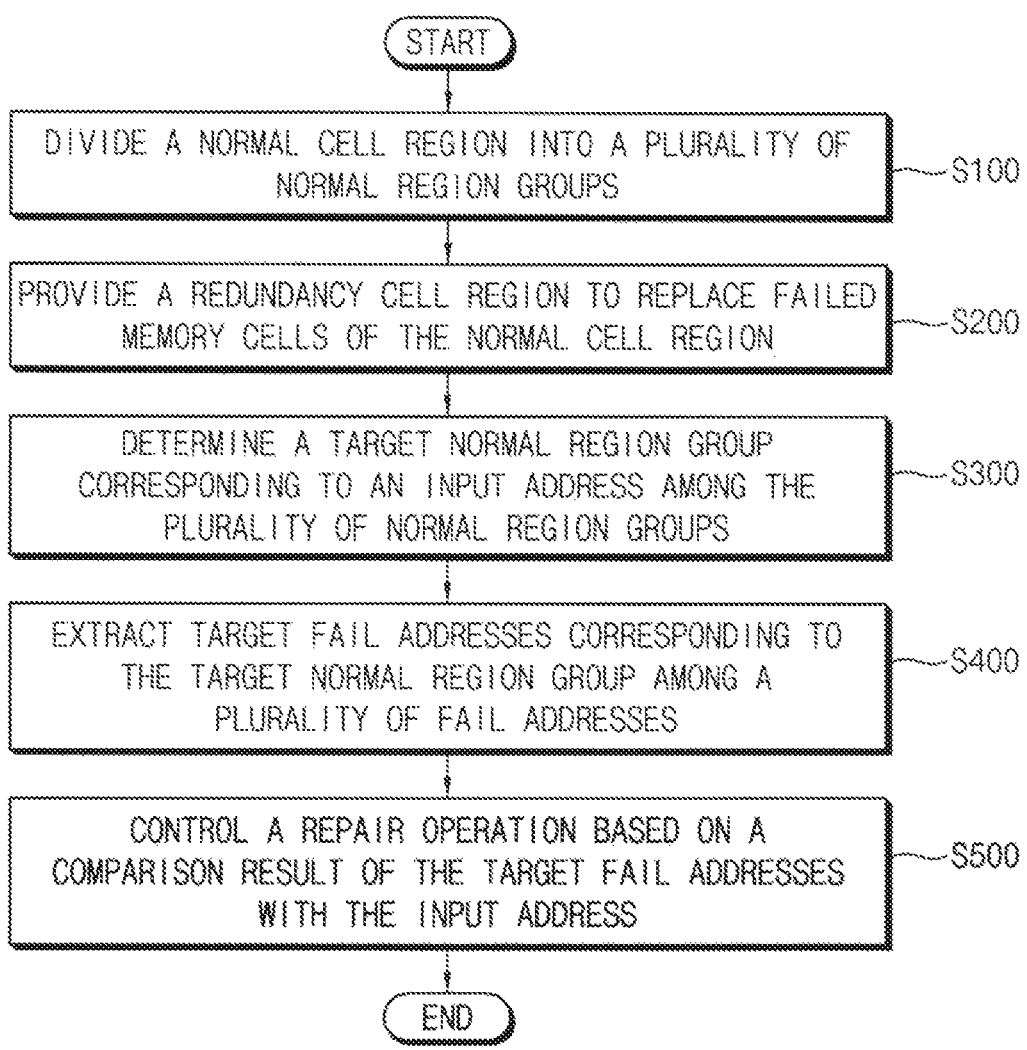
FIG. 1 is a flow chart illustrating a method of operating a semiconductor memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

Figure 2:
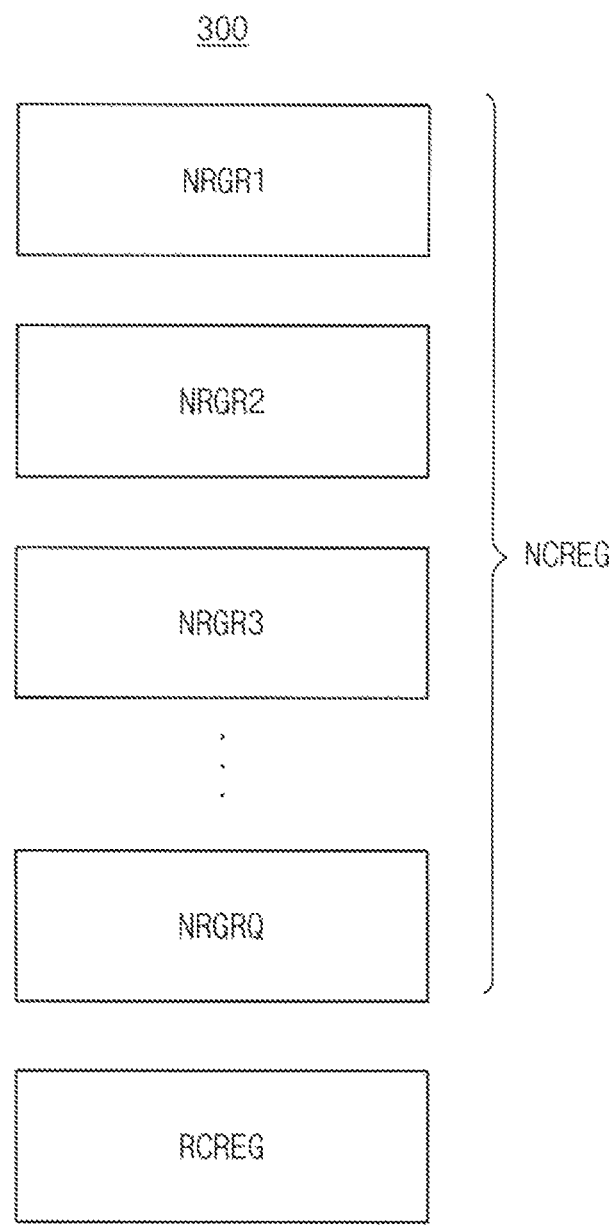
FIG. 2 is a diagram illustrating an example embodiment of a memory cell array included in a semiconductor memory device according to example embodiments.

FIG. 1 is a flow chart illustrating a method of operating a semiconductor memory device according to example embodiments, and FIG. 2 is a diagram illustrating an example embodiment of a memory cell array included in a semiconductor memory device according to example embodiments.

Referring to FIGS. 1 and 2, in operation S100, a normal cell region NCREG is divided into a plurality of normal region groups NRGR1~NRGRQ. In operation S200, a redundancy cell region RCREG is provided to replace failed memory cells of the normal cell region.

In some example embodiments, a portion of a memory cell array 300 formed through semiconductor memory manufacturing processes may be assigned to the normal cell region NCREG and another portion of the memory cell array may be assigned to the redundancy cell region RCREG. In FIG. 2, each normal region group is represented as one distinct region for convenience of illustration, but each of the plurality of normal region groups NRGR1~NRGRQ may be divided into a plurality of sub regions and the sub regions of the same normal region group may be distributed in the memory cell array 300.

As discussed below with reference to FIGS. 3 and 4, a repair control circuit 400 may perform an efficient repair operation using such structure of the memory cell array 300.

For example, in operation S300, the repair control circuit 400 may determine a target normal region group corresponding to an input address among the plurality of normal region groups NRGR1~NRGRQ.

In operation S400, the repair control circuit 400 target fail addresses corresponding to the target normal region group are extracted among a plurality of fail addresses.

In operation S500, the repair control circuit 400 may control a repair operation of the semiconductor memory device based on a comparison result of the target fail addresses with the input address.

Example embodiments of the extraction of the target fail addresses of operation S400 and the repair operation of operation S500 will be described below with reference to FIGS. 6 through 10.

As such, the semiconductor memory device and the method of operating the semiconductor memory device according to example embodiments may reduce a size of the semiconductor memory device by grouping the normal cell region into the plurality of normal region groups to reduce the number of the comparators and the bit number of the fail addresses that are stored and compared.

According to example embodiments, as will be described below with reference to FIGS. 11 through 18, each of the plurality of normal region groups NRGR1~NRGRQ may be divided into a plurality of sub regions and the sub regions adjacent to each other may be included in the different normal region groups. For example, the sub regions included in the respective normal region groups may be arranged one by one sequentially in a column direction according to a round-robin scheme.

As such, the semiconductor memory device and the method of operating the semiconductor memory device according to example embodiments may increase yield of the semiconductor memory device without increase of a size of the semiconductor memory device by dividing each normal region group into a plurality of the sub blocks and disposing the adjacent sub regions in the different normal region groups.

Figure 3:
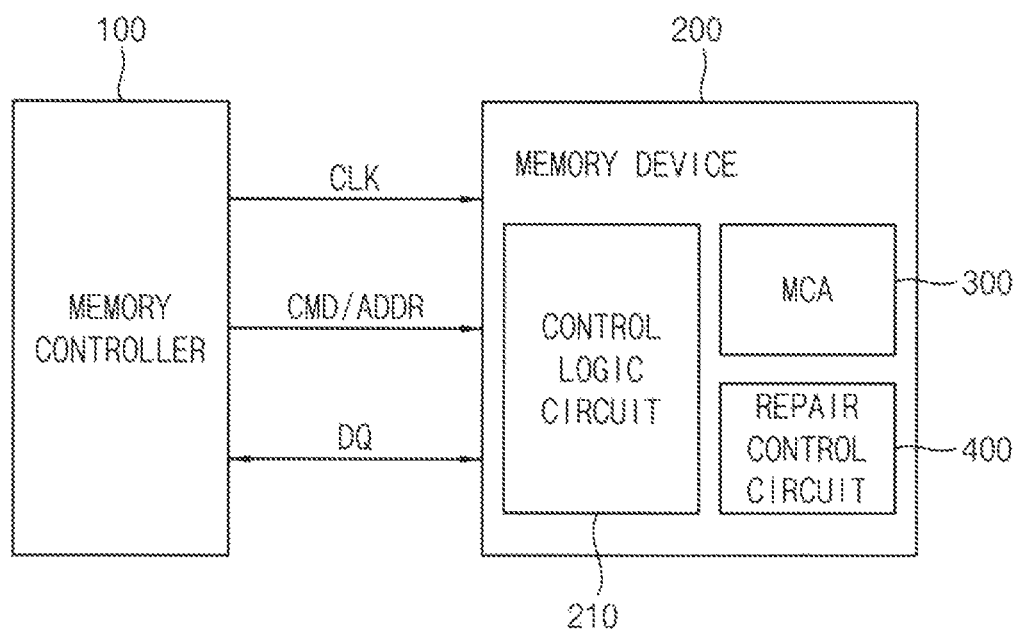
FIG. 3 is a block diagram illustrating a memory system according to an example embodiment.

FIG. 3 is a block diagram illustrating a memory system according to an example embodiment.

Referring to FIG. 3, a memory system 20 may include a memory controller 100 and a semiconductor memory device 200.

The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to a request from the host. In addition, the memory controller 100 may issue operation commands to the semiconductor memory device 200 for controlling the semiconductor memory device 200.

In some example embodiments, the semiconductor memory device 200 may be a memory device including dynamic memory cells such as a dynamic random access memory (DRAM), double data rate 4 (DDR4) synchronous DRAM (SDRAM), a low power DDR4 (LPDDR4) SDRAM or a LPDDR5 SDRAM.

The memory controller 100 may transmit a clock signal CLK, a command CMD and an address (signal) ADDR to the semiconductor memory device 200 and exchange data DQ with the semiconductor memory device 200.

The semiconductor memory device 200 may include a memory cell array MCA 300 that stores the data DQ, a control logic circuit 210 and a repair control circuit 400.

The memory cell array 300 may include a normal cell region including a plurality of normal region groups NRGR1~NRGRQ and a redundancy cell region to replace failed memory cells of the normal cell region, as described above.

The control logic circuit 210 and the repair control circuit 400 may include memory and processing circuitry.

The memory may include at least one of a volatile memory, non-volatile memory, random access memory (RAM), a flash memory, a hard disk drive, and an optical disk drive. The memory may store a stream mapping table 150 and a garbage collection expected cost table 160.

The processing circuitry may be, but not limited to, one or more processors, Central Processing Units (CPUs), controllers, arithmetic logic units (ALUs), digital signal processors, microcomputers, field programmable gate array (FPGAs), Application Specific Integrated Circuit (ASICs), System-on-Chip (SoCs), programmable logic units, microprocessors, or any other devices capable of performing operations in a defined manner.

The processing circuitry may be configured, through a layout design or execution of computer readable instructions stored in a memory (not shown), as a special purpose computer to perform the operations of one or more of the control logic circuit 210 and the repair control circuit 400. The control logic circuit 210 and the repair control circuit 400 may be embodied in discrete processing circuitry or in the same processing circuitry.

For example, the processing circuitry of the control logic circuit 210 may control an access to the memory cell array 300 based on the command CMD and the address ADDR.

Further, the processing circuitry of the repair control circuit 400 may control the repair operation of the semiconductor memory device 200 efficiently using the grouping structure of the memory cell array 300. For example, the repair control circuit 400 may determine a target normal region group corresponding to an input address among the plurality of normal region groups, extract target fail addresses corresponding to the target normal region group among a plurality of fail addresses and then control a repair operation based on a comparison result of the target fail addresses with the input address.

Figure 4:
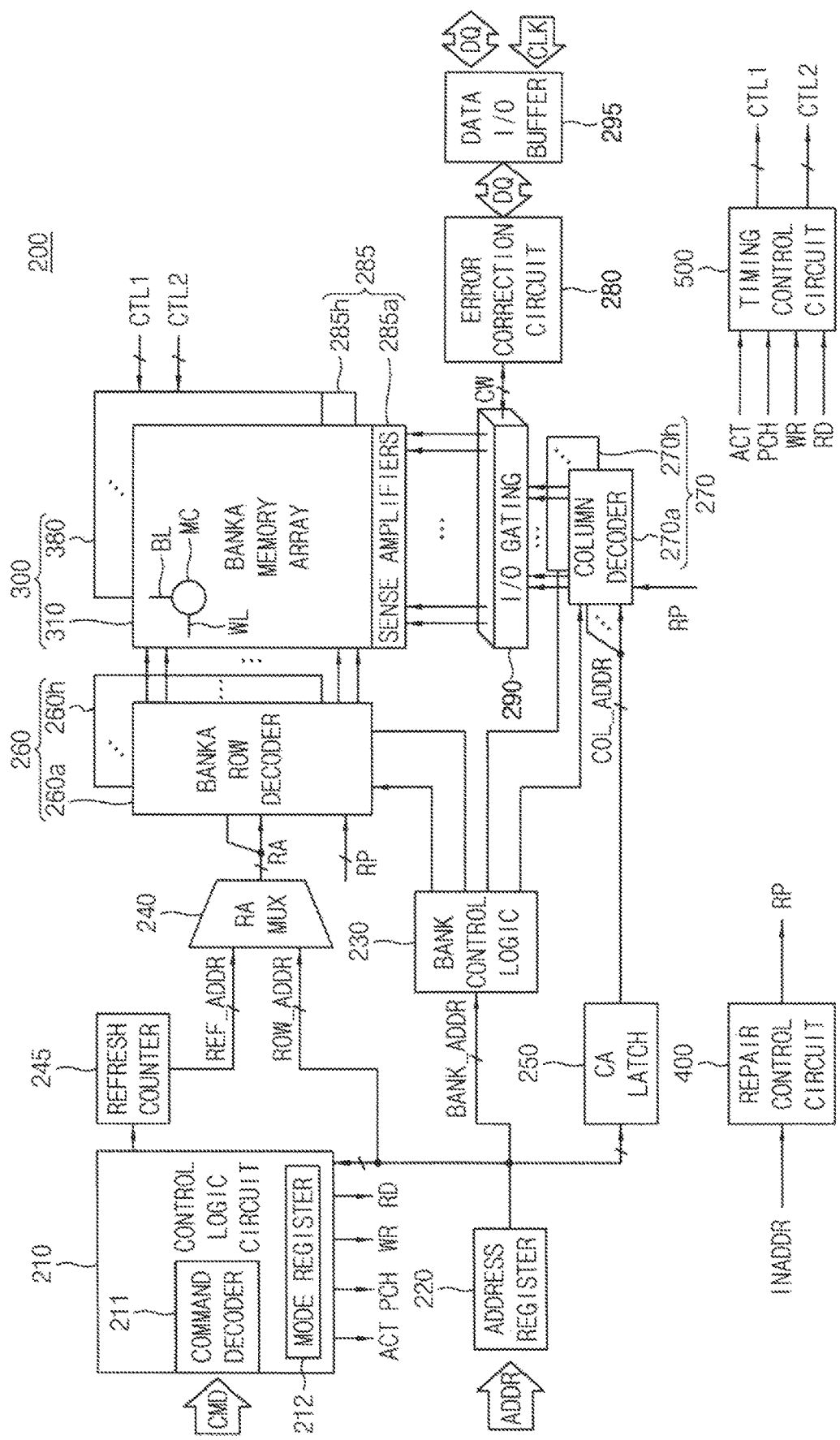
FIG. 4 is a block diagram illustrating a semiconductor memory device according to an example embodiment.

FIG. 4 is a block diagram illustrating a semiconductor memory device according to an example embodiment.

Referring to FIG. 4, a semiconductor memory device 200 may include a control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, an error correction circuit 280, a data I/O buffer 295, a repair control circuit 400 and a timing control circuit 500.

The memory cell array 300 includes first through eighth bank arrays 310-380. The row decoder 260 includes first through eighth bank row decoders 260a-260h respectively coupled to the first through eighth bank arrays 310-380, the column decoder 270 includes first through eighth bank column decoders 270a-270h respectively coupled to the first through eighth bank arrays 310-380, and the sense amplifier unit 285 includes first through eighth bank sense amplifiers 285a-285h respectively coupled to the first through eighth bank arrays 310-380. The first through eighth bank arrays 310-380, the first through eighth bank row decoders 260a-260h, the first through eighth bank column decoders 270a-270h and first through eighth bank sense amplifiers 285a-285h may form first through eighth bank banks. Each of the first through eighth bank arrays 310-380 may include a plurality of memory cells MC formed at intersections of a plurality of word lines WL and a plurality of bit-line BL.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, provide the received row address ROW_ADDR to the row address multiplexer 240 and provide the received column address COL_ADDR to the column address latch 250.

The bank control logic 230 may generate bank control signals in response to the bank address BANK_ADDR. One of the first through eighth bank row decoders 260a-260h corresponding to the bank address BANK_ADDR may be activated in response to the bank control signals, and one of the first through eighth bank column decoders 270a-270h corresponding to the bank address BANK_ADDR may be activated in response to the bank control signals.

The row address multiplexer 240 may receive the row address ROW_ADDR from the address register 220, and receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a-260h.

The activated one of the first through eighth bank row decoders 260a-260h, by the bank control logic 230, may decode the row address RA that is output from the row address multiplexer 240, and activate a word line corresponding to the row address RA. For example, the activated bank row decoder may apply a word line driving voltage to the word line corresponding to the row address RA. In addition, the activated bank row decoder may activate a spare word line corresponding to a spare row address based on a repair control signal RP from the repair control circuit 400 simultaneously with activating the word line corresponding to the row address RA.

The column address latch 250 may receive the column address COL_ADDR from the address register 220, and temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a-270h.

The activated one of the first through eighth bank column decoders 270a-270h may activate a sense amplifier corresponding to the bank address BANK_ADDR and the column address COL_ADDR through the I/O gating circuit 290. In addition, the activated bank column decoder may perform a column repair operation based on the repair control signal RP from the repair control circuit 400.

The I/O gating circuit 290 may include a circuitry for gating input/output data, and further include read data latches for storing data that is output from the first through eighth bank arrays 310-380, and write drivers for writing data to the first through eighth bank arrays 310-380.

Codeword CW read from one bank array of the first through eighth bank arrays 310-380 may be sensed by a sense amplifier coupled to the one bank array from which the data is to be read, and be stored in the read data latches. The codeword CW stored in the read data latches may be provided to the memory controller 100 via the data I/O buffer 295 after ECC decoding is performed on the codeword CW by the error correction circuit 280. The data DQ to be written in one bank array of the first through eighth bank arrays 310-380 may be provided to the data I/O buffer 295 from the memory controller 100 and be written in one bank array by the write drivers after an ECC encoding is performed on the data DQ by the error correction circuit 280.

The data I/O buffer 295 may provide the data DQ from the memory controller 100 to the error correction circuit 280 in a write operation of the semiconductor memory device 200, based on the clock signal CLK and may provide the data DQ from the error correction circuit 280 to the memory controller 100 in a read operation of the semiconductor memory device 200.

The error correction circuit 280, in the write operation, may generate parity bits based on the data DQ from the data I/O buffer 295, and may provide the I/O gating circuit 290 with the codeword CW including the data DQ and the parity bits. The I/O gating circuit 290 may write the codeword CW in one bank array. In addition, the error correction circuit 280, in the read operation, may receive the codeword CW, read from one bank array, from the I/O gating circuit 290. The error correction circuit 280 may perform an ECC decoding on the data DQ based on the parity bits in the codeword CW, correct a single bit error or double bit error in the data DQ and provide corrected data to the data I/O buffer 295.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes a command CMD received from the memory controller 100 and a mode register 212 that sets an operation mode of the semiconductor memory device 200.

For example, the command decoder 211 may generate operation control signals ACT, PCH, WE and RD corresponding to the command CMD by decoding a write enable signal, a row address strobe signal, a column address strobe signal, a chip select signal, etc. The control logic circuit 210 may provide the operation control signals ACT, PCH, WE and RD to the timing control circuit 500. The operation control signals ACT, PCH, WE and RD may include an active signal ACT, a precharge signal PCH, a write signal WE and a read signal RD.

The timing control circuit 500 may generate first control signals CTL1 to control voltage level of the word line WL and second control signals CTL2 to control voltage level of the bit-line BT in response to the operation control signals ACT, PCH, WE and RD, and provide the first control signals CTL1 and the second control signals CTL2 to the memory cell array 300.

The repair control circuit 400 may generate the repair control signal RP based on an input address INADDR. The input address INADDR may be the address ADDR from the memory controller or a portion of the address ADDR.

In some example embodiments, the semiconductor memory device 200 may perform a row repair operation to repair the failed memory cells by unit of a row as will described below with reference to FIGS. 12 through 14. In this case, the input address INADDR may include as least a portion of the row address ROW_ADDR. In other example embodiments, the semiconductor memory device 200 may perform a column repair operation to repair the failed memory cells by unit of a column in each memory block as will described below with reference to FIGS. 15 through 18. In this case, the input address INADDR may include as least a portion of the row address ROW_ADDR and at least a portion of the column address COL_ADDR.

The repair control circuit 400 may provide the repair control signal RP to the corresponding bank row decoder 260a to 260h and/or the corresponding bank column decoder 270a to 270h. The corresponding bank row decoder and/or the corresponding bank column decoder may perform the repair operation based on the repair signal RP to access redundancy memory cells in the redundancy cell region to replace the failed memory cells in the normal cell region. The repair control circuit 400 will be discussed in more detail below with reference to FIGS. 6 to 10.

Figure 5:
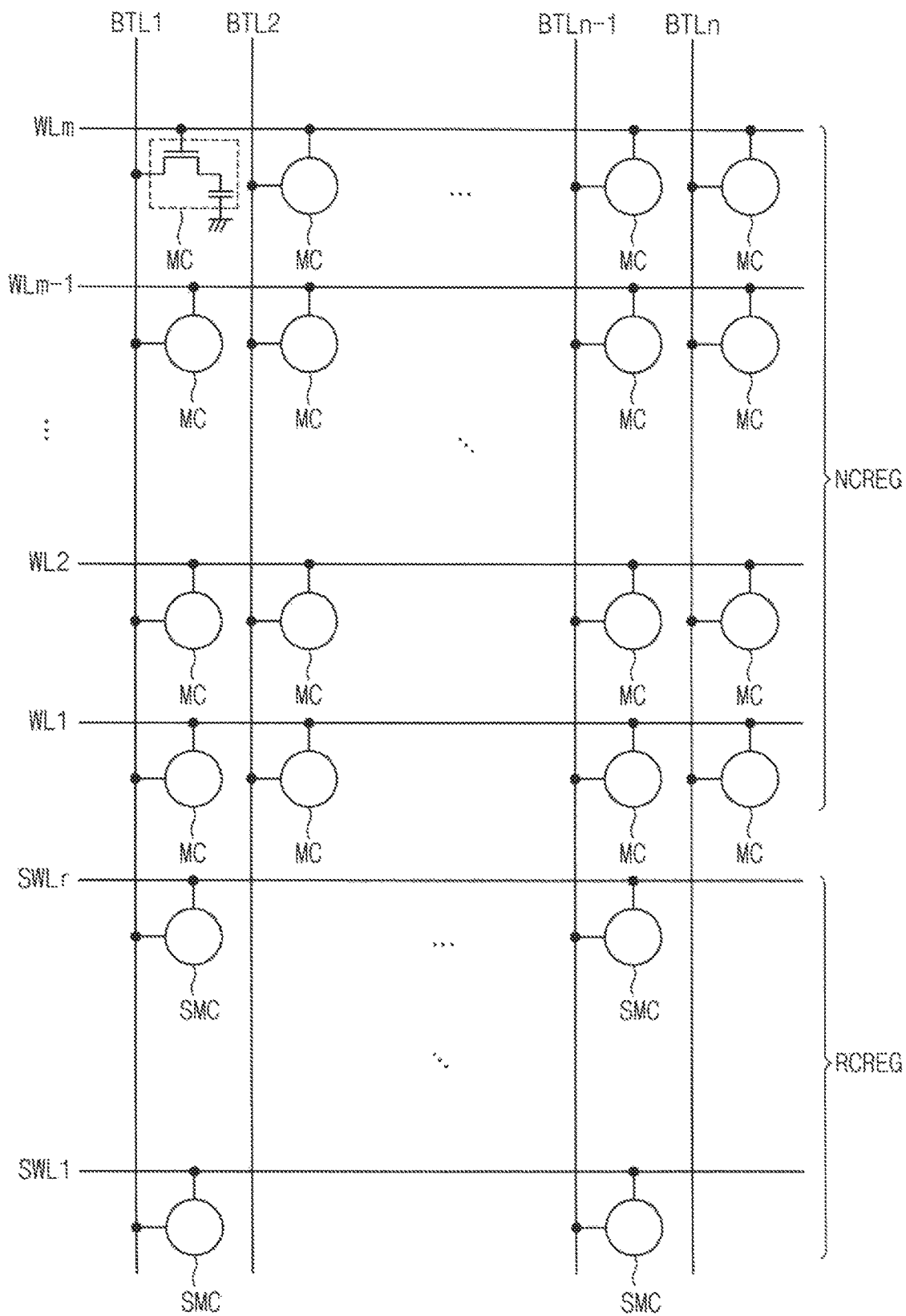
FIG. 5 is a diagram illustrating an example of a bank array in the semiconductor memory device of FIG. 4.

FIG. 5 is a diagram illustrating an example of a bank array in the semiconductor memory device of FIG. 4.

Referring to FIG. 5, a bank array may include a normal cell region NCREG and a redundancy cell region RCREG. The normal cell region NCREG may include a plurality of word lines WL1~WLm (where m is a natural number greater than two), a plurality of bit-lines BL1~BLn (where n is a natural number greater than two), and a plurality of memory cells MCs disposed at intersections between the word lines WL1~WLm and the bit-lines BL1~BLn. The redundancy cell region RCREG may include a plurality of spare word lines SWL1~SWLr (where r is a natural number greater than two), the bit-lines BL1~BLn, and a plurality of spare memory cells SMCs disposed at intersections between the spare word lines SWL1~SWLr and the bit-lines BL1~BLn.

As described above, the normal cell region NCREG may be grouped into a plurality of normal region groups and each normal region group may include a plurality of sub regions. The normal cell region NCREG may have an interleaving structure or a scattering structure such that the adjacent sub regions are included in the different normal region groups.

Figure 6:
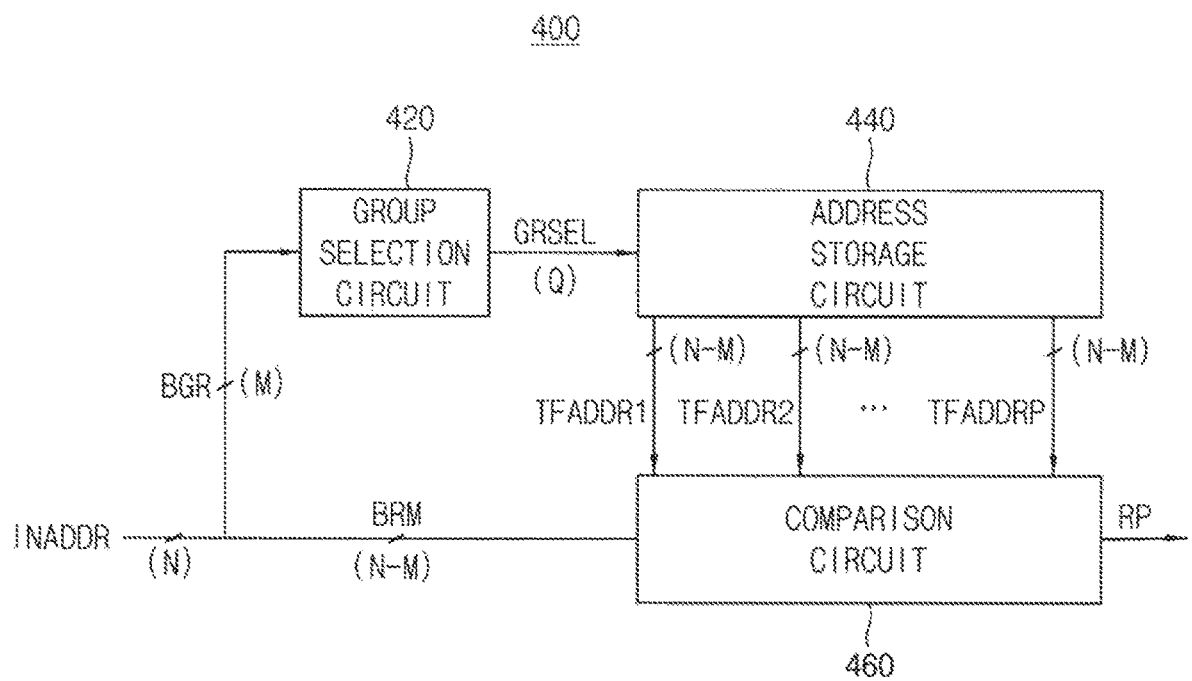
FIG. 6 is a block diagram illustrating an example embodiment of a repair control circuit included in the semiconductor memory device according to example embodiments.

FIG. 6 is a block diagram illustrating an example embodiment of a repair control circuit included in the semiconductor memory device according to example embodiments.

Referring to FIG. 6, a repair control circuit 400 may include a group selection circuit 420, an address storage circuit 440 and a comparison circuit 460.

The group selection circuit 420 may generate a plurality of group selection signals GRSEL of Q bits representing the target normal region group based on group identity bits BGR of M bits included in the input address INADDR. In some example embodiments, the bit numbers may satisfy Q=2^M as will be described with reference to FIG. 7.

The address storage circuit 440 may store a plurality of fail addresses and extract and provide target fail addresses TFADDR1~TFADDRP among the plurality of fail addresses based on the plurality of group selection signals GRSEL. Each of the target fail addresses TFADDR1~TFADDRP may be N-M bits.

The comparison circuit 460 may compare the target fail addresses TFADDR1~TFADDRP with other bits or remaining bits BRM of N-M bits of the input address INADDR except the group identity bits BGR and generate the repair control signal RP based on the comparison result of the other bits BRM and the target fail addresses TFADDR1~TFADDRP.

When the bit number of the input address INADDR is N and the bit number of the group identity bits BGR is M, the bit number of the other bits BRM of the input address INADDR except the group identity bits BGR is N-M. The address storage circuit 440 may store the plurality of fail addresses of N-M bits and thus the bit number of each of the target fail addresses TFADDR1~TFADDRP may be N-M. The comparison circuit 460 may perform a bitwise comparison of the other bits BRM and each target fail address to generate the repair control signal RP.

The comparison circuit 460 according to example embodiments may compare the N–M bits in the input address INADDR and the N–M bits of each target fail address, whereas conventional repair control circuits compare N-bit input address and N-bit fail address. As such, the address storage circuit 440 may store the fail addresses of the reduced bit number and thus a size of the address storage circuit 440 may be reduced. In addition, the bit number of the addresses to be compared by the comparison circuit 460 may be reduced and thus a size of the comparison circuit 460 may be reduced. Further, as will be described below, the number of the fail addresses to be compared may be reduced. In this case, the number of the comparators in the comparison circuit 460 may be reduced and thus the size of the comparison circuit 460 may be further reduced.

In case of a semiconductor memory device, a redundancy circuitry may be designed for each row of directional wiring lines and each column of directional wiring lines, and may include a fuse block for recording the address information of failed memory cells. When an access is made to the failed memory cells, the replaced memory cells are accessed instead of the failed memory cells through the repair process by using the fuse block. The fuse block may include a plurality of fuse wiring lines. By conducting a fuse cutting process, in which a specified fuse among a plurality of fuses is cut using laser, the address information of the repaired memory cells may be recorded. In order to record the address information of the repaired memory cells, a plurality of fuses may be needed. In general, fuses may be provided for the respective bits of an address. For example, in order to record the repair information of an 16-bit address, at least 16 fuses may be needed.

In order to record one repaired address, one fuse block may be needed. Therefore, as the number of fuse blocks increases, an increased number of failed memory cells may be replaced, whereby an increased number of semiconductor memory device with failed memory cells may be converted into good products. Since an increased area is occupied as the number of fuse blocks increases, limitations exist in integrating an increased number of fuse blocks. Thus, the number of fuse blocks to be designed may be determined based on chip size and manufacturing yield.

The semiconductor memory device and the method of operating the semiconductor memory device according to example embodiments may reduce a size of the semiconductor memory device by grouping the normal cell region into the plurality of normal region groups to reduce the number of the comparators and the bit number of the fail addresses that are stored and compared.

Figure 7:
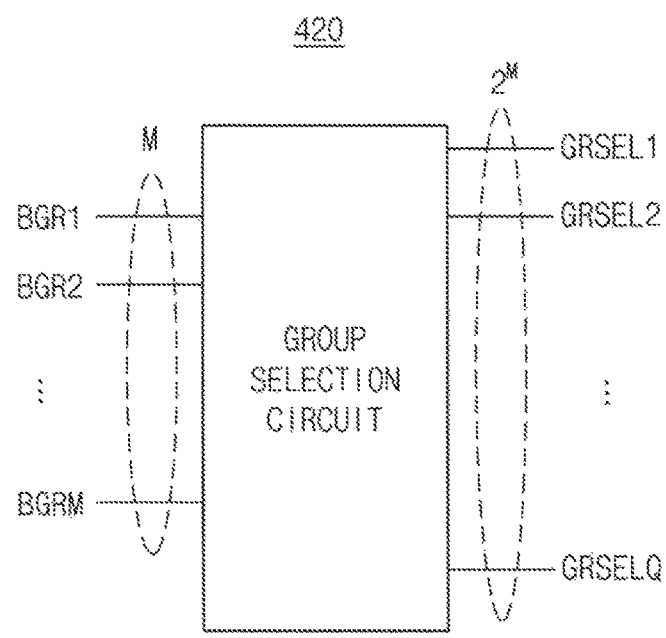
FIG. 7 is a diagram illustrating an example embodiment of a group selection circuit included in the repair control circuit of FIG. 6.

FIG. 7 is a diagram illustrating an example embodiment of a group selection circuit included in the repair control circuit of FIG. 6.

Referring to FIG. 7, a group selection circuit 420 may generate group selection signals GRSEL1~GRSELQ of Q bits representing a target normal region group based on the group identity bits BGR1~BGRM of M bits of the input address INADDR, where Q=2^M. For example, Q may be 4=2^2 when M is 2, or Q may be 8=2^3 when M is 3.

The group selection circuit 420 may decode the group identity bits BGR1~BGRM to activate one of the group selection signals GRSEL1~GRSELQ and deactivate the other of the group selection signals GRSEL1~GRSELQ. Using the group selection signals GRSEL1~GRSELQ that are activated selectively based on the group identity bits BGR1~BGRM, the address storage circuit 440 may extract and provide the target fail addresses corresponding to the activated group selection signal.

Figure 8:
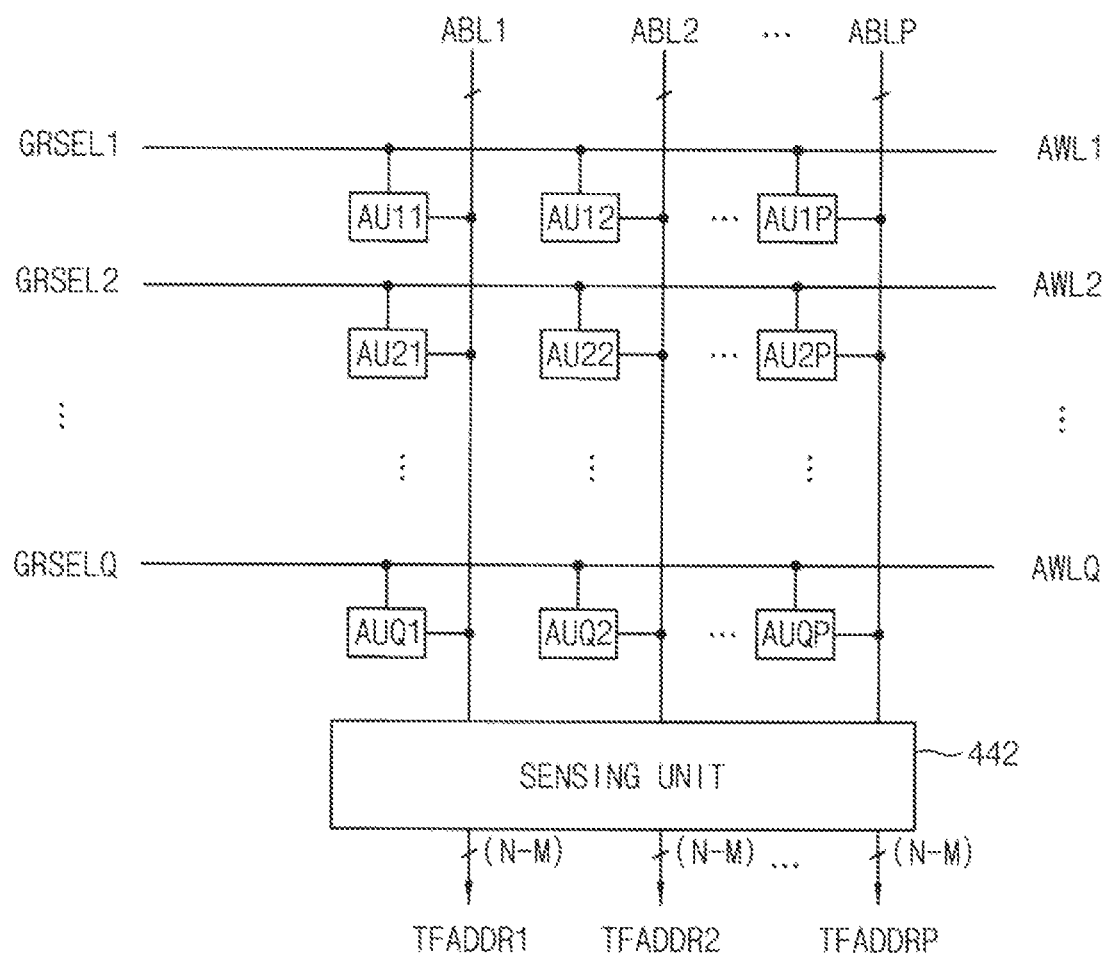
FIG. 8 is a diagram illustrating an example embodiment of an address storage circuit included in the repair control circuit of FIG. 6.

FIG. 8 is a diagram illustrating an example embodiment of an address storage circuit included in the repair control circuit of FIG. 6.

Referring to FIG. 8, an address storage circuit 440 may include a plurality of address units AU11~AUQP, word lines AW1~AWLQ to access the address units AU11~AUQP, bit lines ABL1~ABLP to transfer the address from the accessed address units and a sensing circuit 442 to sense the address transferred through the bit lines ABL1~ABLP.

The address units AU11~AUQP in each row may store the fail addresses of a corresponding normal region group. The address units AU11~AU1P in the first row may store the fail addresses of the first normal region group, the address units AU21~AU2P in the second row may store the fail addresses of the second normal region group, and in this way the address units AUQ1~AUQP in the Q-th row may store the fail addresses of the Q-th normal region group.

As described above, only one of the group selection signals GRSEL1~GRSELQ corresponding to the target normal region group may be activated and the other of the group selection signals GRSEL1~GRSELQ may be deactivated. Accordingly the address units in the row corresponding to the target normal region group may be selected and the fail addressed stored in the selected address units may be provided as the target fail addresses TFADDR1~TFADDRP.

In some example embodiments, the address units in FIG. 8 may be implemented with nonvolatile memory cells. In this case, the fail address may be programmed directly in the address units.

In other example embodiments, the address units in FIG. 8 may be implemented with volatile memory cells. In this case, the fail addresses may be loaded into the address units, for example, during a booting process of the semiconductor memory device. For example, the address units may be implemented with static random access memory (SRAM) cells that do not require refresh operations.

As described above, each address unit may store each fail address of N–M bits corresponding to the other bits BRM of N–M bits in the input address INADDR of N bits except the group identity bits BGR of M bits. In other words, the bit number of the fail address to be stored is N–M that is smaller than the entire bit number N of the input address INADDR. In comparison with the conventional schemes to store the fail addresses of N bits, only N–M bits of the fail addresses may be stored an thus the size of the address storage circuit 440 may be reduced.

Figure 9:
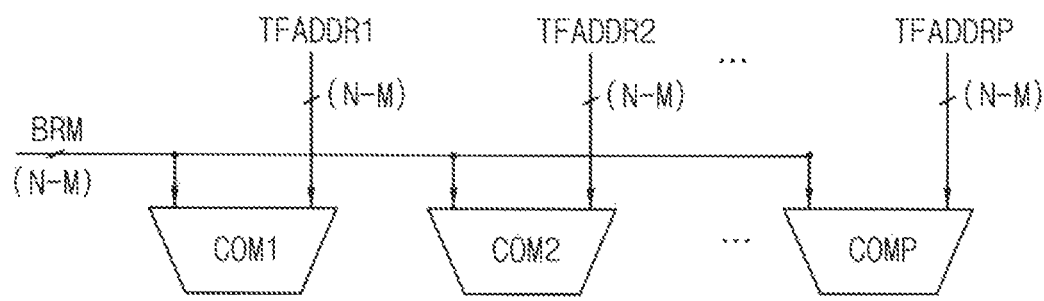
FIG. 9 is a diagram illustrating an example embodiment of a comparison circuit included in the repair control circuit of FIG. 6.

FIG. 9 is a diagram illustrating an example embodiment of a comparison circuit included in the repair control circuit of FIG. 6.

Referring to FIG. 9, a comparison circuit 460 may include a plurality of comparators COM1~COMP to compare the target fail addresses TFADDR1~TFADDRP respectively with the other bits BRM of the input address INADDR except the group identity bits BGR.

The address storage circuit 440 of FIG. 8 may store the P fail addresses for each normal region group and the comparison circuit 460 may include the P comparators. The target fail addresses TFADDR1~TFADDRP provided to the comparison circuit 460 are changed according to the target normal region group corresponding to the input address INADDR. In other words, the comparison circuit 460 may be shared by a plurality of normal region groups.

When the number of the normal region groups is Q, the maximum number of the fail addresses that can be stored in the address storage circuit 460 is P*Q. In conventional schemes, the P*Q comparators may be utilized to compare all of the fail addresses with the input address at the same time to increase the speed of the repair operation. In contrast, in one or more example embodiments, P comparators corresponding to the number of the target fail addresses TFADDR1~TFADDRP are included in the comparison circuit 460, and thus the size of the comparison circuit 460 may be reduced.

Figure 10:
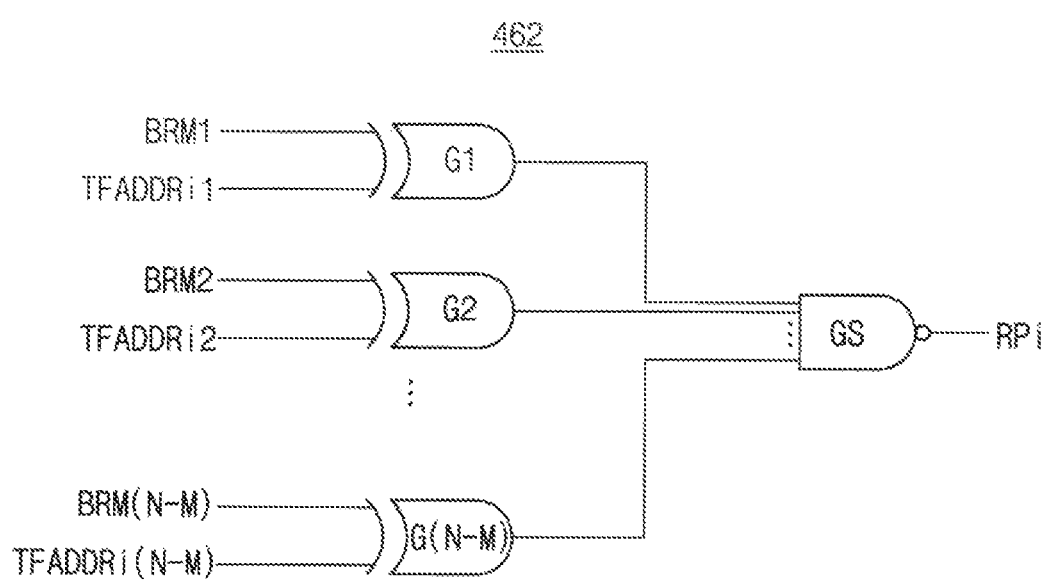
FIG. 10 is a diagram illustrating an example embodiment of a comparator included in the repair control circuit of FIG. 9.

FIG. 10 is a diagram illustrating an example embodiment of a comparator included in the repair control circuit of FIG. 9.

Referring to FIG. 10, a comparator 462 may include a plurality of logic gates G1~G(N–M) and an output gate GS. The logic gates G1~G(N–M) may perform a bitwise comparison of bits TFADDRi1~TFADDRi(N–M) of the target fail address TFADDRi and other bits BRM1~BRM(N–M) of the input address INADDR except the group identity bits BGR. The output gate GS may perform a logic operation on the outputs of the logic gates G1~G(N–M) to generate a repair control signal RPi.

FIG. 10 illustrates a non-limiting example that the logic gates G1~G(N–M) are implemented with XOR gates and the output gate GS is implemented with a NAND gate, but the combination of the gates in the comparator 462 may be determined variously.

In conventional schemes, each comparator may utilize N logic gates to perform a bitwise comparison of the fail address and the input address of N bits. In contrast, in one or more example embodiments, the comparator 462 may utilize the N–M logic gates G1~G(N–M) to perform a bitwise comparison of the other bits BRM of the input address INADDR and the target fail address of N–M bits. Accordingly the number of the logic gates included in each comparator may be reduced and thus the size of the comparison circuit 460 may be further reduced.

Hereinafter, a first direction D1 is a row direction along which word lines extend and a second direction D2 is a column direction along which bit lines extend.

Figure 11:
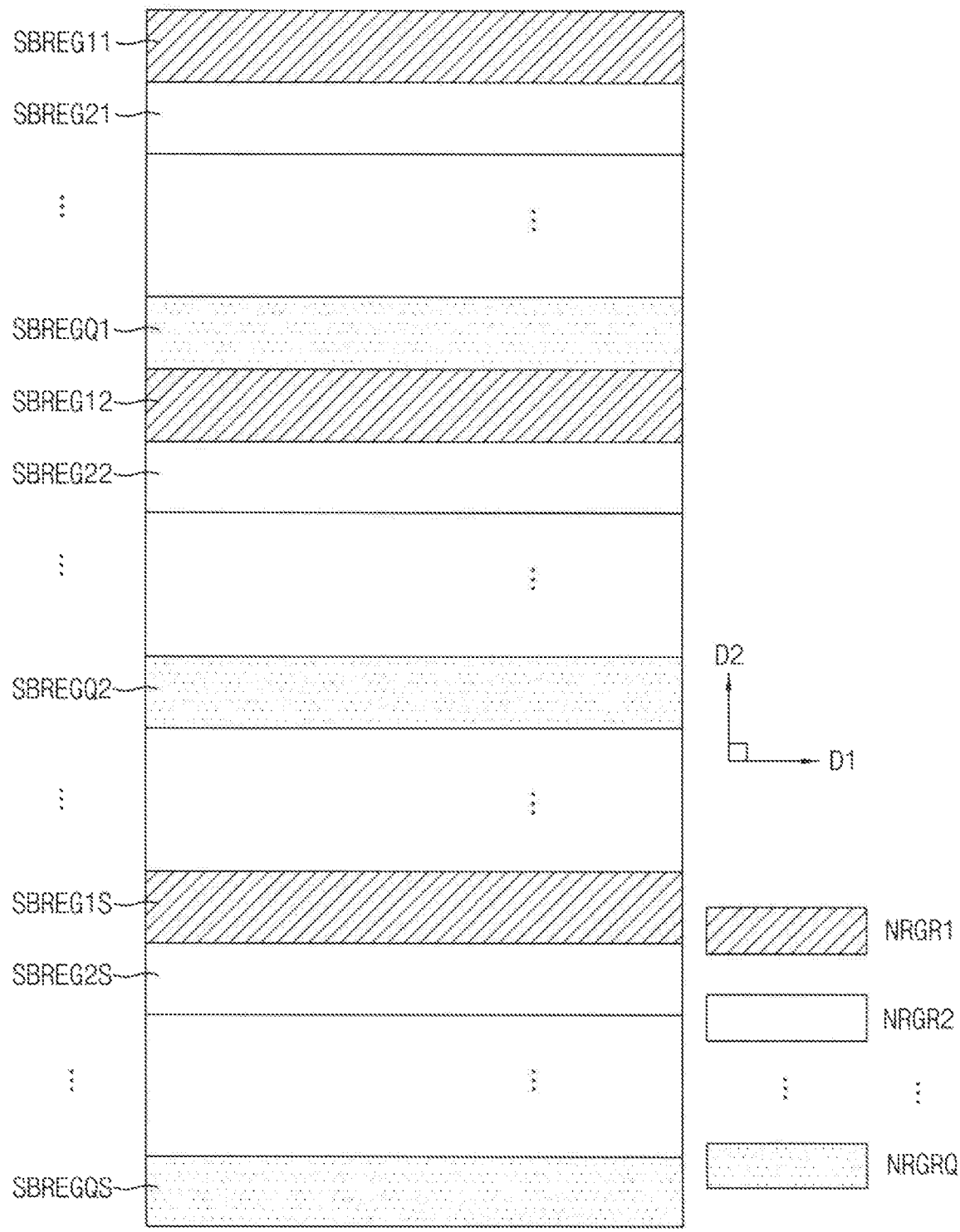
FIG. 11 is a diagram illustrating an example embodiment of a normal cell region included in a semiconductor memory device according to example embodiments.

FIG. 11 is a diagram illustrating an example embodiment of a normal cell region included in a semiconductor memory device according to example embodiments.

Referring to FIG. 11, a normal cell region NCREG may include a plurality of normal region groups NRGR1~NRGRQ and each of the plurality of normal region groups NRG1~NRGQ may include a plurality of sub regions. The first normal region group NRGR1 may include first through S-th sub regions SBREG11~SBREG1S, the second normal region group NRGR2 may include first through S-th sub regions SBREG21~SBREG2S, and in this way the Q-th normal region group NRGRQ may include first through S-th sub regions SBREGQ1~SBREGQS.

According to example embodiments, the normal cell region NCREG may have an interleaving structure or a scattering structure such that the adjacent sub regions are included in the different normal region groups. FIG. 11 illustrates an example embodiment in which the sub regions SBREG11~SBREGQS included in the respective normal region groups NRGR1~NRGRQ are arranged one by one sequentially in a column direction according to a round-robin scheme.

Defects caused in a memory cell array may include a defect due to vulnerable bit line sense amplifier, a defect of particle type, a defect of multi-bit type. In other words, the defects have a locality such that the failed memory cells tend to be concentered in a small region. Conventionally, a memory cell array may be divided into the plurality of normal region groups NRGR1~NRGRQ and the maximum repair resources for each normal region group may be limited. As such, the chip size may be reduced by limiting flexibility of the repair operation, but the flexibility limitation may cause an excessive decrease in yield of the semiconductor memory device in case of the local defects.

In contrast, according to example embodiments, each normal region group may be divided into a plurality of sub regions and the sub regions may be arranged in the scattering structure, for example, by the round-robin scheme to distribute the local defect to the plurality of normal region groups. Thus the yield of the semiconductor memory device may be increased without increase in the size of the semiconductor memory device or the chip size.

Figure 12:
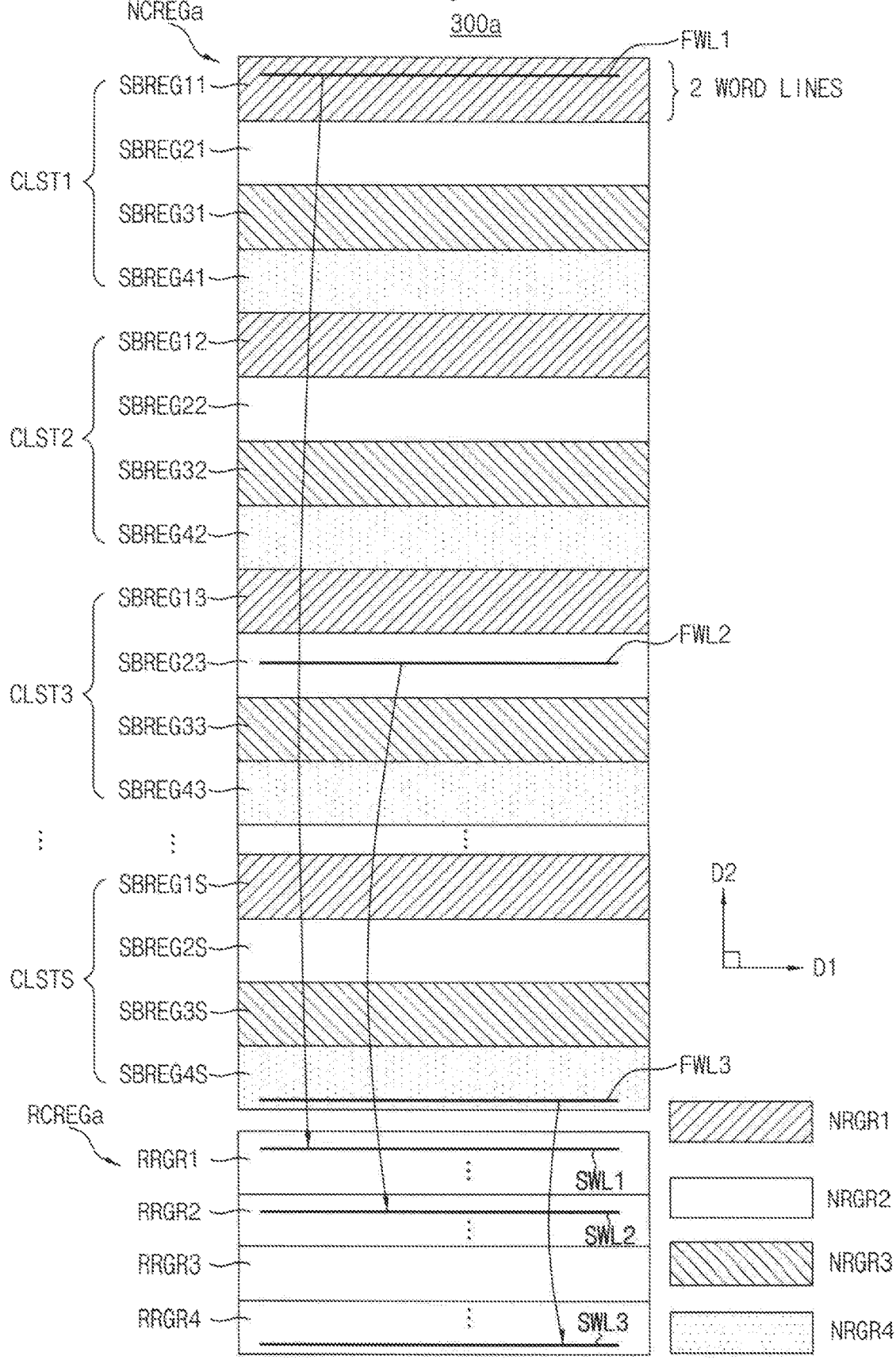
FIG. 12 is a diagram illustrating an example embodiment of a memory cell array included in a semiconductor memory device according to example embodiments.
Figure 13:
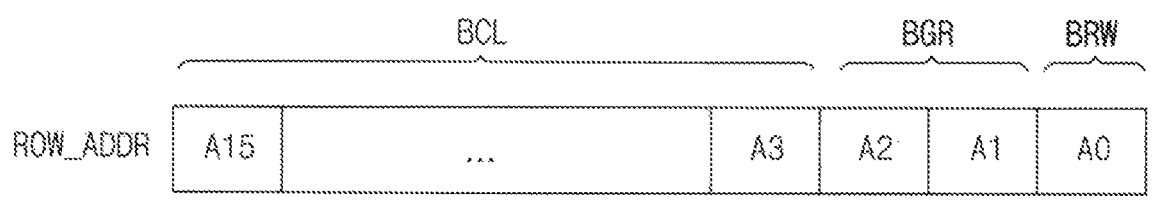
FIG. 13 is a diagram illustrating an example of an input address corresponding to the memory cell array of FIG. 12.

FIG. 12 is a diagram illustrating an example embodiment of a memory cell array included in a semiconductor memory device according to example embodiments, and FIG. 13 is a diagram illustrating an example of an input address corresponding to the memory cell array of FIG. 12.

FIG. 12 illustrates a row repair operation to repair failed memory cells by unit of a row.

Referring to FIG. 12, a memory cell array 300*a* may include a normal cell region NCREGa and a redundancy cell region RCREGa.

The normal cell region NCREGa may include a plurality of normal region groups NRGR1~NRGR4. FIG. 12 illustrates four normal region groups NRGR1~NRGR4 for convenience of illustration and description, and the normal cell region NCREGa may include an arbitrary number of normal region groups.

Each of the plurality of normal region groups NRGR1~NRGR4 may include a plurality of sub regions. The first normal region group NRGR1 may include first through S-th sub regions SBREG11~SBREG1S, the second normal region group NRGR2 may include first through S-th sub regions SBREG21~SBREG2S, the third normal region group NRGR3 may include first through S-th sub regions SBREG31~SBREG3S, and the fourth normal region group NRGR4 may include first through S-th sub regions SBREG41~SBREG4S.

According to example embodiments, as illustrated in FIG. 12, the sub regions SBREG11~SBREG4S included in the respective normal region groups NRGR1~NRGR4 may be arranged one by one sequentially in the column direction D2 according to a round-robin scheme.

The first sub regions SBREG11~SBREG41 respectively included in the first through fourth normal region groups NRGR1~NRGR4 are arranged sequentially in the column direction D2 to form a first cluster region CLST1, the second sub regions SBREG12~SBREG42 respectively included in the first through fourth normal region groups NRGR1~NRGR4 are arranged sequentially in the column direction D2 to form a second cluster region CLST2, and in this way the S-th sub regions SBREG1S~SBREG4S respectively included in the first through fourth normal region groups NRGR1~NRGR4 are arranged sequentially in the column direction D2 to form an S-th cluster region CLSTS.

Each of the plurality of sub regions SBREG11~SBREG4S may correspond to one or more word lines. For example each sub region may correspond to two word lines. When the number of the cluster regions CLST1~CLSTS is $S=2^{13}$, the row address ROW_ADDR may be represented by 16 address bits A0~A15 as illustrated in FIG. 13.

Referring to FIG. 13, the row address ROW_ADDR corresponding to an input address may include sub region identity bits BCL, group identity bits BGR and row identity bits BRW. The group identity bits BGR may correspond to the two address bits A1 and A2 to represent a target normal region group among the plurality of normal region groups NRGR1~NRGR4. The sub region identity bits BCL may correspond to the thirteen address bits A3~A15 to represent a target sub region among the plurality of sub regions. In other words, the sub region identity bits BCL may represent a target cluster region corresponding to the row address ROW_ADDR among the plurality of cluster regions CLST1~CLSTS. The row identity bits BRW may correspond to the one address bit A0 to represent a position of a target row or a target word line in each sub region.

As such, the group identity bits BGR may be less significant bits than the sub region identity bits BCL in the row address ROW, ADDR, which indicates that the sub regions SBREG11~SBREG4S included in the respective normal region groups NRGR1~NRGR4 are arranged one by one sequentially in the column direction D2 according to a round-robin scheme.

Referring back to FIG. 12, the redundancy cell region RCREGa may include a plurality of redundancy region groups RRGR1~RRGR4 corresponding to the plurality of normal region groups NRGR1~NRGR4, respectively. Each of the plurality of the redundancy region groups RRGR1~RRGR4 may replace the failed memory cells in the corresponding normal region group among the plurality of normal region groups NRGR1~NRGR4. For example, as illustrated in FIG. 12, a first fail word line FWL1 in the first normal region group NRGR1 may be replaced with a first spare word line SWL1 in the first redundancy region group RRGR1, a second fail word line FWL2 in the second normal region group NRGR2 may be replaced with a second spare word line SWL2 in the second redundancy region group RRGR2, and a third fail word line FWL3 in the third normal region group NRGR3 may be replaced with a third spare word line SWL3 in the third redundancy region group RRGR3.

Figure 14:
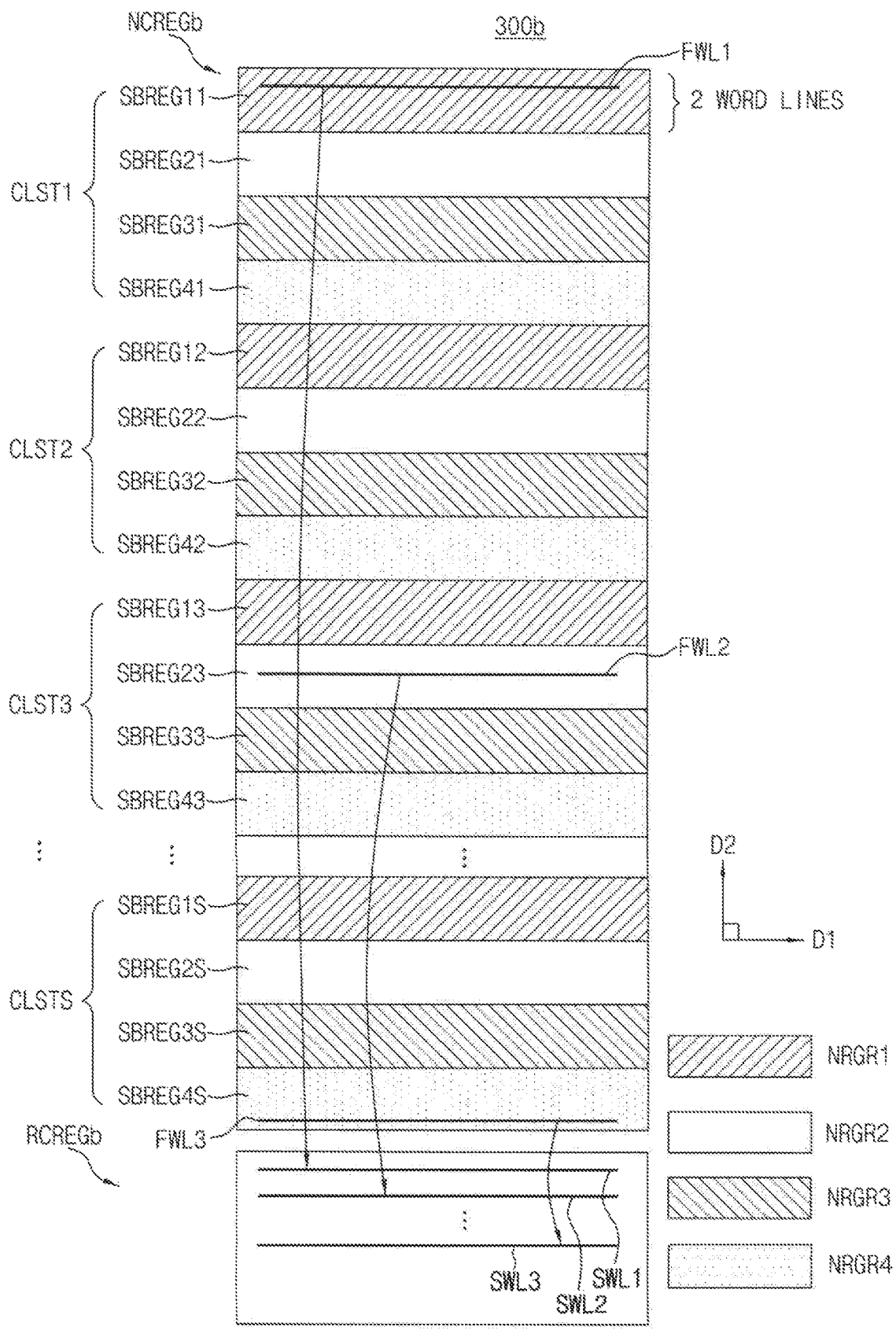
FIG. 14 is a diagram illustrating an example embodiment of a memory cell array included in a semiconductor memory device according to example embodiments.

FIG. 14 is a diagram illustrating an example embodiment of a memory cell array included in a semiconductor memory device according to example embodiments.

A normal cell region NCREGb in a memory cell array 300b of FIG. 14 is substantially the same as the normal cell region NCREGa in the memory cell array 300a of FIG. 12, and the repeated descriptions are omitted.

Referring to FIG. 14, the redundancy cell region RCREGb may be shared by the plurality of normal region groups NRGR1~NRGR4 to replace the failed memory cells in the plurality of normal region groups NRGR1~NRGR4. For example, as illustrated in FIG. 14, a first fail word line FWL1 in the first normal region group NRGR1, a second fail word line FWL2 in the second normal region group NRGR2 and a third fail word line FWL3 in the third normal region group NRGR3 may be replaced with a first spare word line SWL1, a second spare word line SWL2 and a third spare word line SWL3 in the redundancy cell region RCREGb without dividing the redundancy cell region RCREGb.

Figure 15:
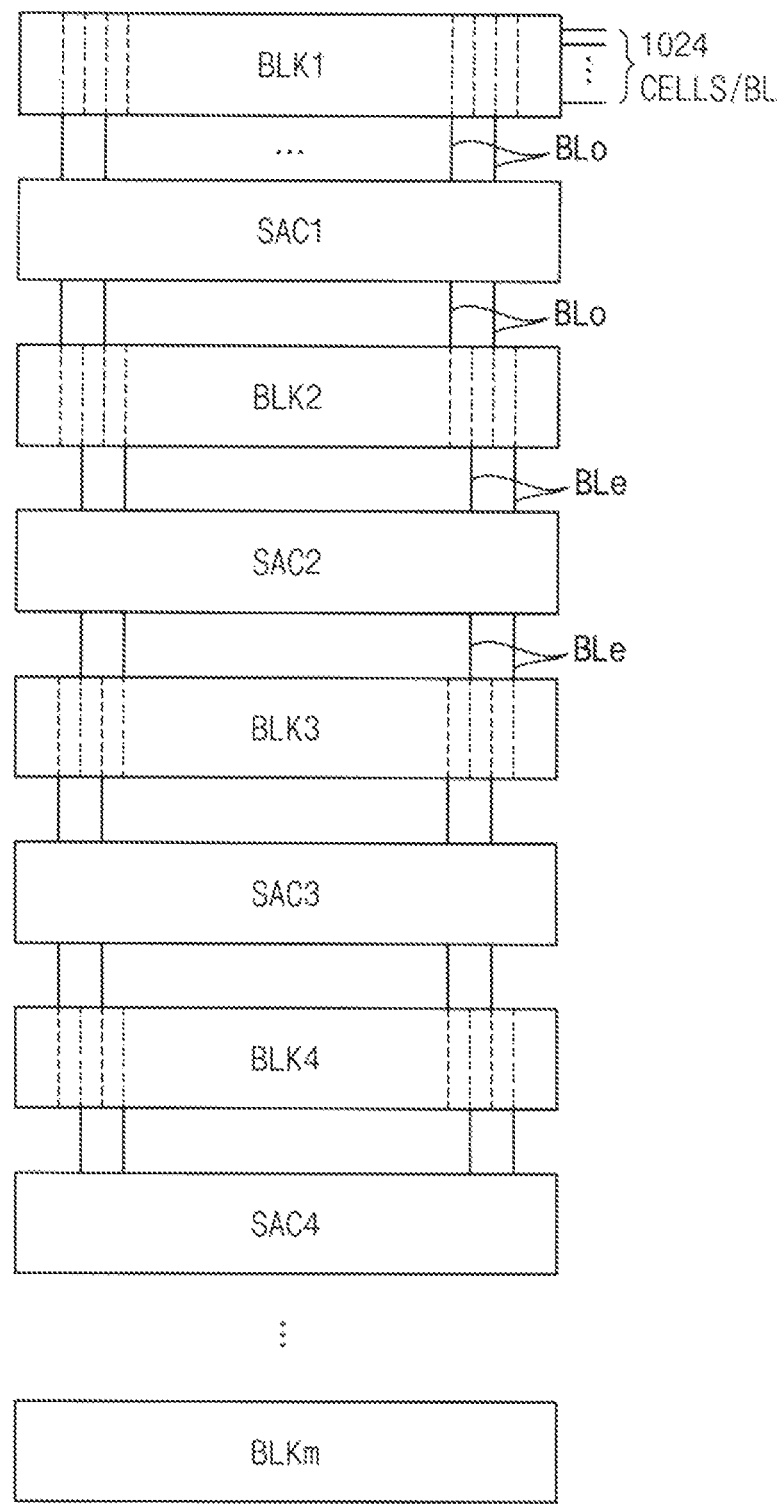
FIG. 15 is a diagram illustrating an example embodiment of a bank array included in a semiconductor memory device according to example embodiments.

FIG. 15 is a diagram illustrating an example embodiment of a bank array included in a semiconductor memory device according to example embodiments.

Referring to FIG. 15, a memory bank may include a plurality of memory blocks BLK1~BLKm. The sense amplifier unit 285 in FIG. 4 may include a plurality of sense amplifier circuits SAC1~SAC4 that are distributed in the memory bank. Each of the memory blocks BLK1~BLKm may include a desired (or, alternatively, a predetermined) number of wordlines. For example, each of the memory blocks BLK1~BLKm may include 1024 word lines, that is, 1024 memory cells per bitline.

As illustrated in FIG. 15, each of the sense amplifier circuits SAC1~SAC4 may be connected to the two adjacent memory blocks disposed at the top and bottom sides. For example, each of the sense amplifier circuits SAC1~SAC4 may be connected to only the odd-numbered bitlines of the top-side memory block and bottom-side memory block or only the even-numbered bitlines of the top-side memory block and the bottom-side memory block.

In this structure, the memory blocks BLK1~BLKm may be assigned to the sub regions as described above, respectively.

Figure 16:
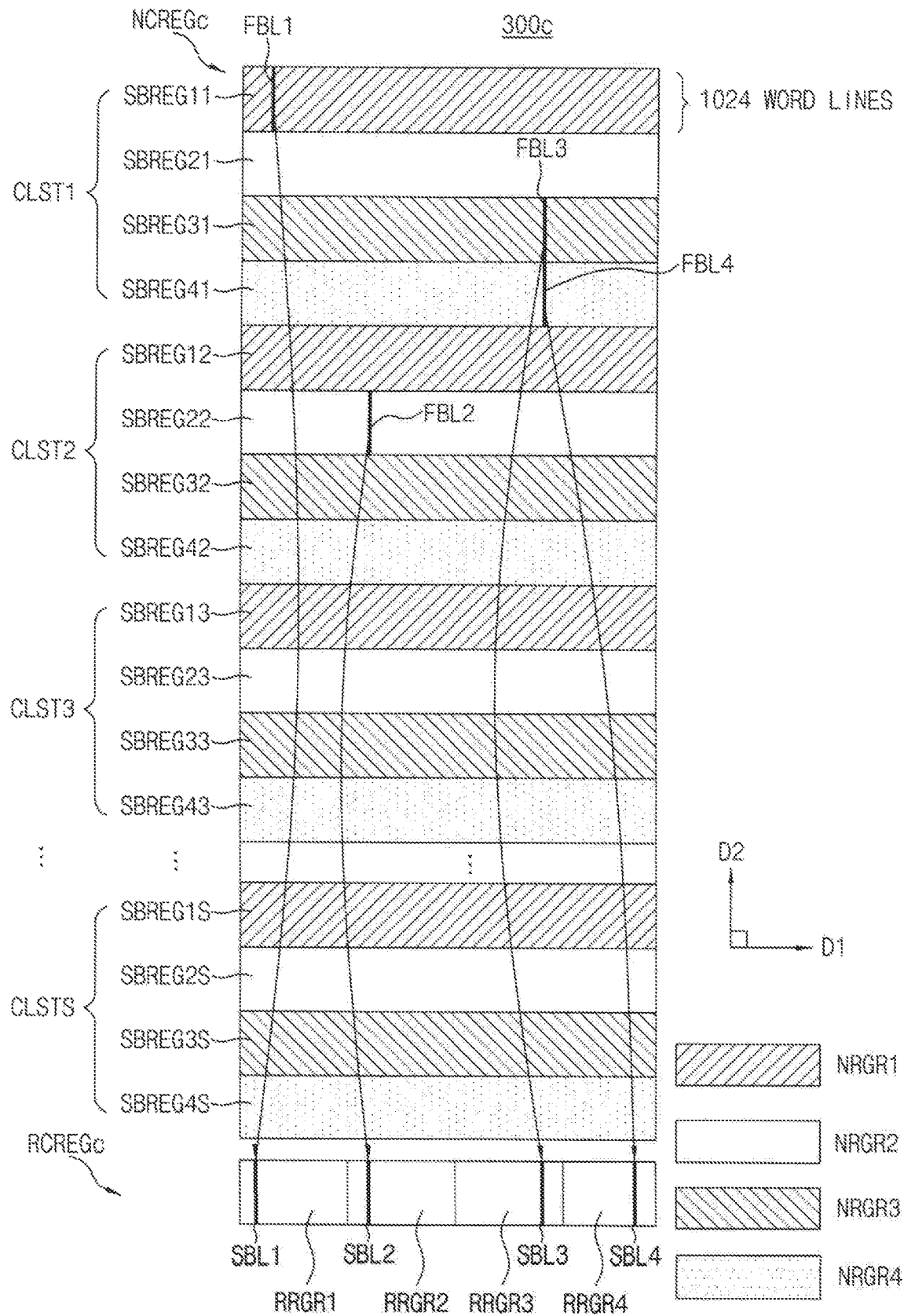
FIG. 16 is a diagram illustrating an example embodiment of a memory cell array included in a semiconductor memory device according to example embodiments.
Figure 17:
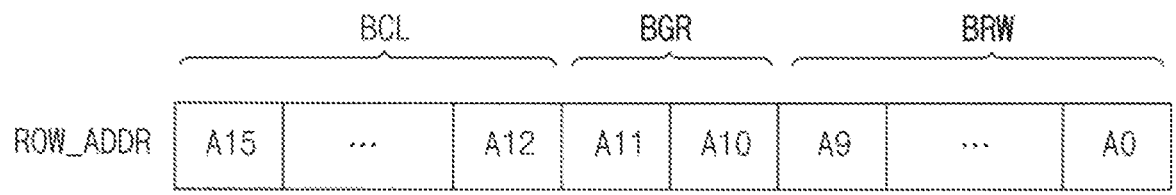
FIG. 17 is a diagram illustrating an example of an input address corresponding to the memory cell array of FIG. 16.

FIG. 16 is a diagram illustrating an example embodiment of a memory cell array included in a semiconductor memory device according to example embodiments, and FIG. 17 is a diagram illustrating an example of an input address corresponding to the memory cell array of FIG. 16.

FIG. 16 is a diagram illustrating an example embodiment of a memory cell array included in a semiconductor memory device according to example embodiments, and FIG. 13 is a diagram illustrating an example of an input address corresponding to the memory cell array of FIG. 12.

FIG. 16 illustrates a column repair operation to repair failed memory cells by unit of a column.

Referring to FIG. 16, a memory cell array 300c may include a normal cell region NCREGc and a redundancy cell region RCREGc. The normal cell region NCREGc may include a plurality of normal region groups NRGR1~NRGR4. FIG. 16 illustrates four normal region groups NRGR1~NRGR4 for convenience of illustration and description, and the normal cell region NCREGc may include an arbitrary number of normal region groups.

Each of the plurality of normal region groups NRGR1~NRGR4 may include a plurality of sub regions. The first normal region group NRGR1 may include first through S-th sub regions SBREG11~SBREG1S, the second normal region group NRGR2 may include first through S-th sub regions SBREG21~SBREG2S, the third normal region group NRGR3 may include first through S-th sub regions SBREG31~SBREG3S, and the fourth normal region group NRGR4 may include first through S-th sub regions SBREG41~SBREG4S.

According to example embodiments, as illustrated in FIG. 16, the sub regions SBREG11~SBREG4S included in the respective normal region groups NRGR1~NRGR4 may be arranged one by one sequentially in the column direction D2 according to a round-robin scheme.

The first sub regions SBREG11~SBREG41 respectively included in the first through fourth normal region groups NRGR1~NRGR4 are arranged sequentially in the column direction D2 to form a first cluster region CLST1, the second sub regions SBREG12~SBREG42 respectively included in the first through fourth normal region groups NRGR1~NRGR4 are arranged sequentially in the column direction D2 to form a second cluster region CLST2, and in this way the S-th sub regions SBREG1S~SBREG4S respectively included in the first through fourth normal region groups NRGR1~NRGR4 are arranged sequentially in the column direction D2 to form an S-th cluster region CLSTS.

The plurality of sub regions SBREG11~SBREG4S may correspond to the memory blocks as described with reference to FIG. 15. For example, each sub region may be a memory block corresponding to 1024 word lines. When the number of the cluster regions CLST1~CLSTS is $S=2^4$, the row address ROW_ADDR may be represented by 16 address bits A0~A15 as illustrated in FIG. 17.

Referring to FIG. 17, the row address ROW_ADDR corresponding to an input address may include sub region identity bits BCL, group identity bits BGR and row identity bits BRW. Even though not illustrated in FIG. 17, the above-described input address INADDR may include a column address COL_ADDR in addition to the row address ROW_ADDR. The group identity bits BGR may correspond to the two address bits A1 and A2 to represent a target normal region group among the plurality of normal region groups NRGR1~NRGR4. The sub region identity bits BCL may correspond to the four address bits A12~A15 to represent a target sub region among the plurality of sub regions. In other words, the sub region identity bits BCL may represent a target cluster region corresponding to the row address ROW_ADDR among the plurality of cluster regions CLST1~CLSTS. The row identity bits BRW may correspond to the ten address bits A0~A9 to represent a position of a target row or a target word line in each sub region.

As such, the group identity bits BGR may be less significant bits than the sub region identity bits BCL in the row address ROW, ADDR, which indicates that the sub regions SBREG11~SBREG4S included in the respective normal region groups NRGR1~NRGR4 are arranged one by one sequentially in the column direction D2 according to a round-robin scheme.

Referring back to FIG. 16, the redundancy cell region RCREGa may include a plurality of redundancy region groups RRGR1~RRGR4 corresponding to the plurality of normal region groups NRGR1~NRGR4, respectively. Each of the plurality of the redundancy region groups RRGR1~RRGR4 may replace the failed memory cells in the corresponding normal region group among the plurality of normal region groups NRGR1~NRGR4. For example, as illustrated in FIG. 16, a first fail bit line FBL1 in the first normal region group NRGR1 may be replaced with a first spare bit line SBL1 in the first redundancy region group RRGR1, a second fail bit line FBL2 in the second normal region group NRGR2 may be replaced with a second spare bit line SBL2 in the second redundancy region group RRGR2, a third fail bit line FBL3 in the third normal region group NRGR3 may be replaced with a third spare bit line SBL3 in the third redundancy region group RRGR3 and a fourth fail bit line FBL4 in the fourth normal region group NRGR4 may be replaced with a fourth spare bit line SBL4 in the fourth redundancy region group RRGR4.

Figure 18:
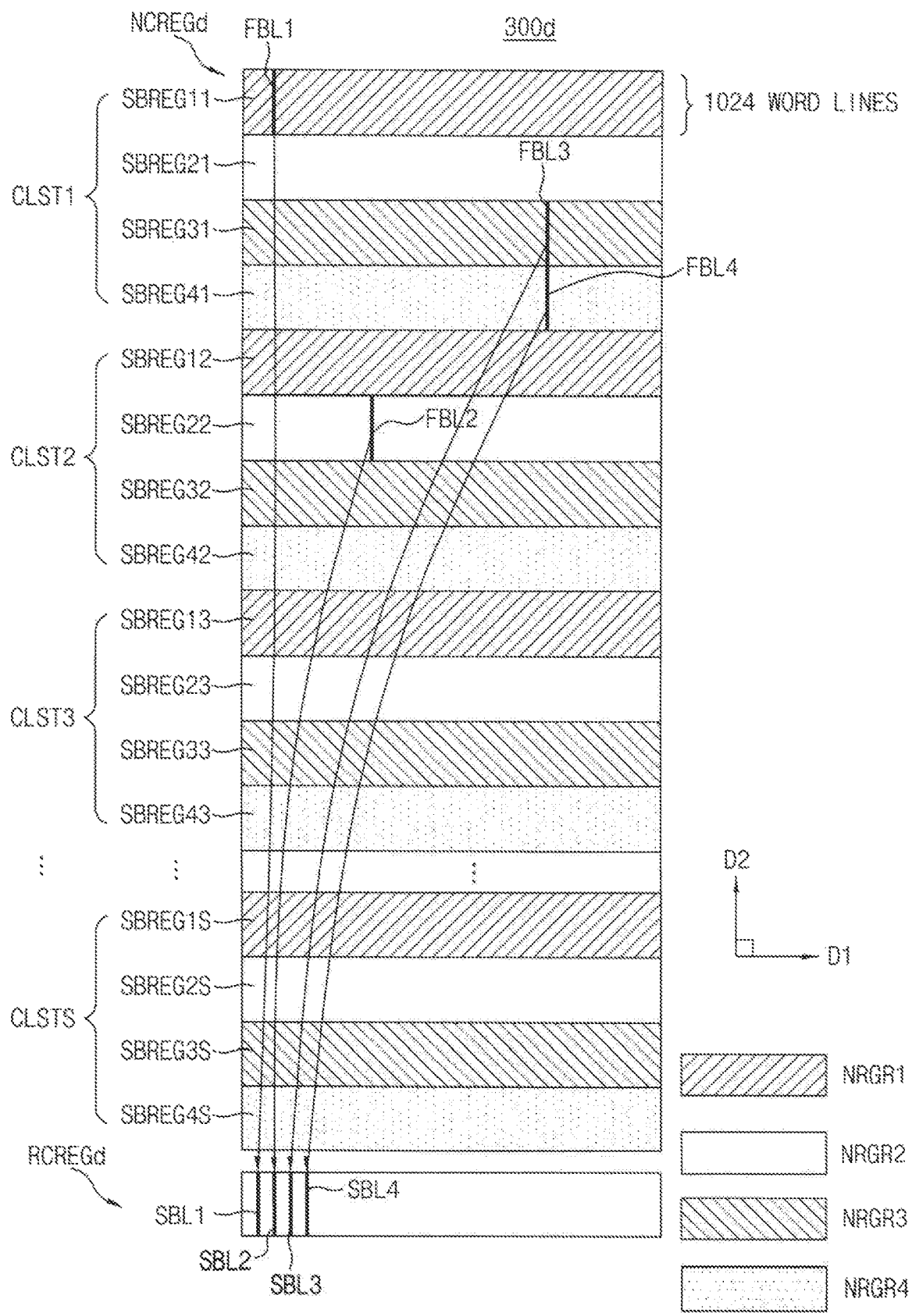
FIG. 18 is a diagram illustrating an example embodiment of a memory cell array included in a semiconductor memory device according to example embodiments.

FIG. 18 is a diagram illustrating an example embodiment of a memory cell array included in a semiconductor memory device according to example embodiments.

A normal cell region NCREGd in a memory cell array 300d of FIG. 18 is substantially the same as the normal cell region NCREGc in the memory cell array 300c of FIG. 16, and the repeated descriptions are omitted.

Referring to FIG. 18, the redundancy cell region RCREGd may be shared by the plurality of normal region groups NRGR1~NRGR4 to replace the failed memory cells in the plurality of normal region groups NRGR1~NRGR4. For example, as illustrated in FIG. 18, a first fail bit line FBL1 in the first normal region group NRGR1, a second fail bit line FBL2 in the second normal region group NRGR2, a third fail bit line FBL3 in the third normal region group NRGR3 and a fourth fail bit line FBL4 in the fourth normal region group NRGR4 may be replaced with a first spare bit line SBL1, a second spare bit line SBL2, a third spare bit line SBL3 and a fourth spare bit line SBL4 in the redundancy cell region RCREGd without dividing the redundancy cell region RCREGd.

Figure 19:
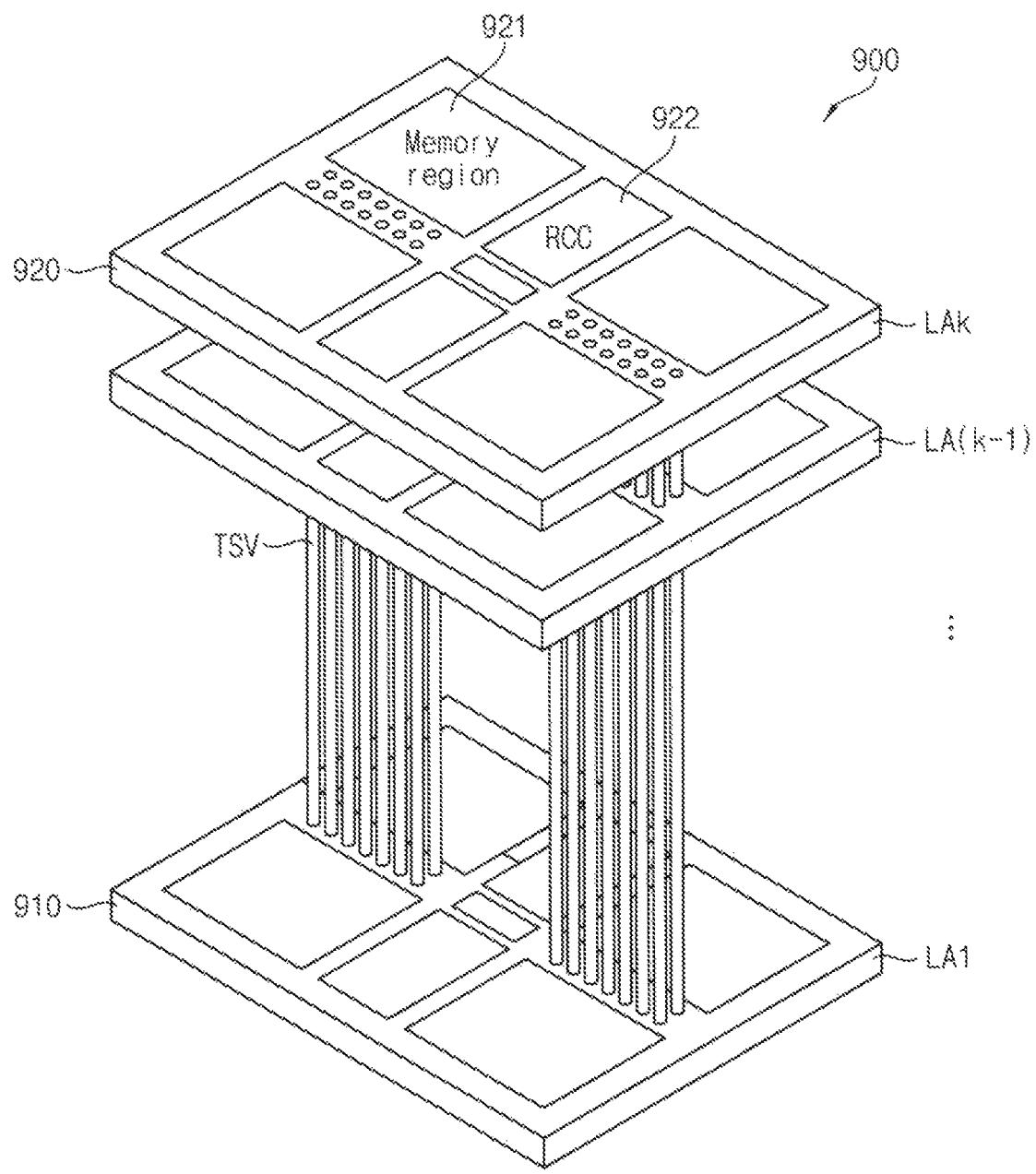
FIGS. 19 and 20 are diagrams illustrating a stacked memory device according to example embodiments.
Figure 20:
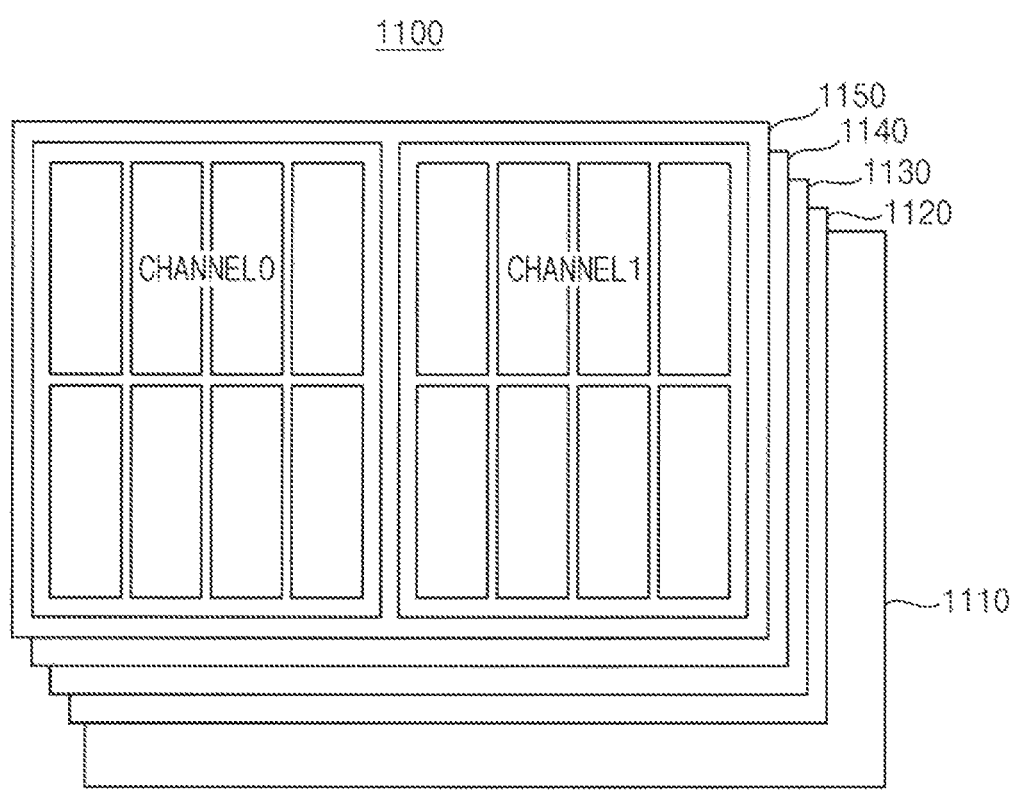

FIGS. 19 and 20 are diagrams illustrating a stacked memory device according to example embodiments.

Referring to FIG. 19, a semiconductor memory device 900 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each of the first semiconductor integrated circuit layer 910 through the kth semiconductor integrated circuit layer 920 may include memory regions 921 and peripheral circuits 922 for driving the memory regions 921. For example, the peripheral circuits 922 may include a row-driver for driving wordlines of a memory, a column-driver for driving bit lines of the memory, a data input-output circuit for controlling input-output of data, a command buffer for receiving a command from an outside source and buffering the command, and an address buffer for receiving an address from an outside source and buffering the address.

The first semiconductor integrated circuit layer 910 may further include a control circuit. The control circuit may control access to the memory region 921 based on a command and an address signal from a memory controller and may generate control signals for accessing the memory region 921.

Each of the semiconductor integrated circuit layers LA2 through LAk corresponding to the slave layer may include a memory cell array having above-described structure and a repair control circuit RCC 922 as described above.

The memory device 900 may be a three-dimensional (3D) vertical array structure including vertical NAND strings that are vertically oriented such that at least one memory cell is located over another memory cell. The at least one memory cell may include a charge trap layer. The following patent documents, which are hereby incorporated by reference in their entireties, describe suitable configurations for a memory cell array including a 3D vertical array structure, in which the 3D memory array is configured as a plurality of levels, with wordlines and/or bitlines shared between levels: U.S. Pat. Nos. 7,679,133, 8,553,466, 8,654,587, and 8,559,235, and US Pat. Pub. No. 2011/0233648.

Although the memory cell array included in the nonvolatile memory device according to example embodiments is described based on a flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

FIG. 20 illustrates an example high bandwidth memory (HBM) organization.

Referring to FIG. 20, the HBM 1100 may be configured to have a stack of multiple DRAM semiconductor dies 1120, 1130, 1140 and 1150. The HBM of the stack structure may be optimized by a plurality of independent interfaces called channels. Each DRAM stack may support up to 8 channels in accordance with the HBM standards. FIG. 20 shows an example stack containing 4 DRAM semiconductor dies 1120, 1130, 1140 and 1150 and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die disposed at bottom of the stack structure to provide signal routing and other functions. Some function for the DRAM semiconductor dies 1120, 1130, 1140 and 1150 may be implemented in the interface die 1110.

Each of the DRAM semiconductor dies 1120, 1130, 1140 and 1150 may include a memory cell array having above-described structure and a repair control circuit as described above.

Figure 21:
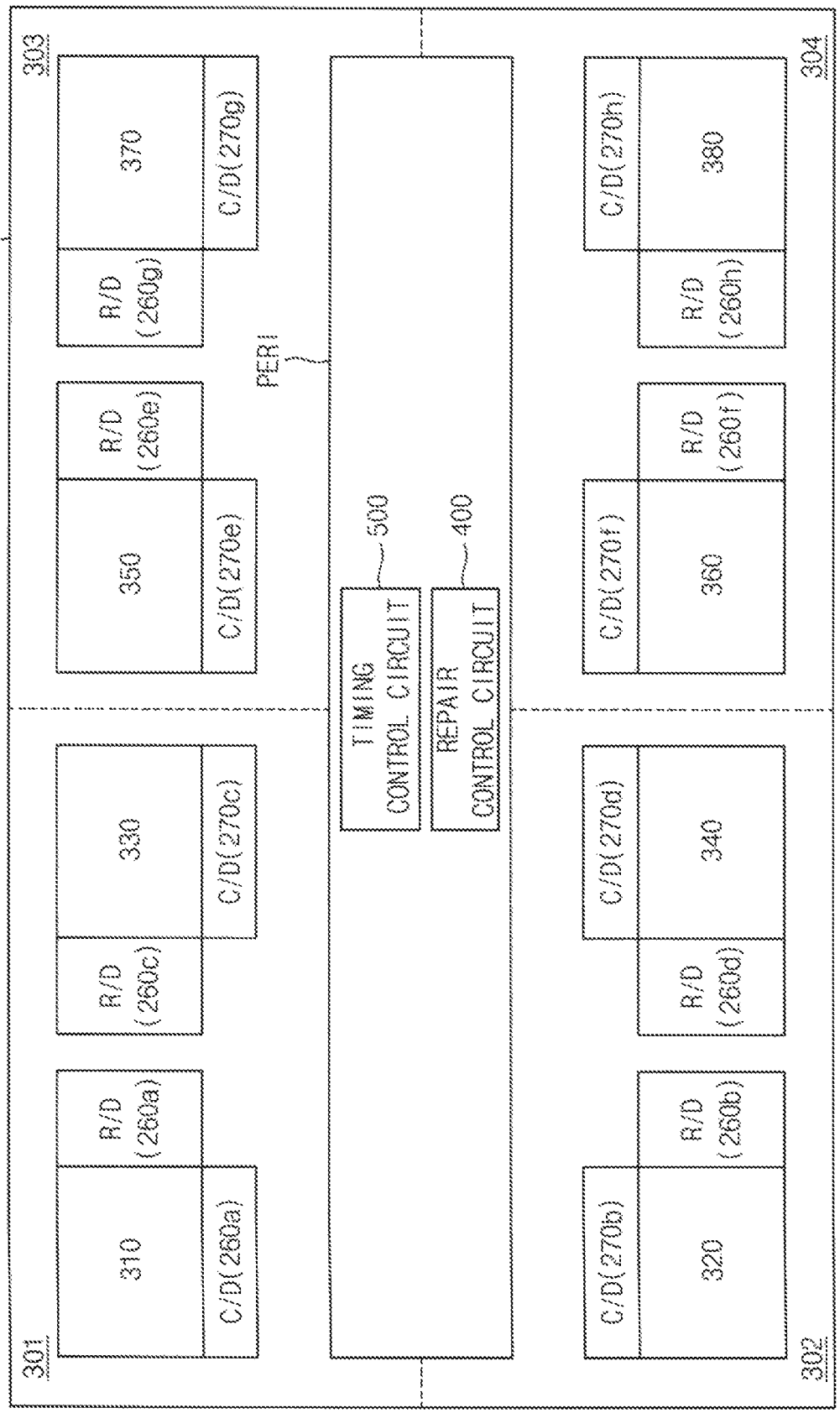
FIG. 21 is a diagram illustrating an example arrangement of the semiconductor memory devices of FIGS. 19 and 20.

FIG. 21 is a diagram illustrating an example arrangement of the semiconductor memory devices of FIGS. 19 and 20.

Referring to FIG. 21, a semiconductor memory device 200 may include first through eighth bank arrays 310-380, first through eighth bank row decoders 260a-260h, first through eighth bank column decoders 270a-270h, a timing control circuit 500 and a repair control circuit 400. According to an example embodiment, the first through eighth bank arrays may be distributed in a core region of the substrate.

The first bank array 310 and the third bank array 330 may be arranged in a first region 305 of a substrate, the second bank array 320 and the fourth bank array 340 may be arranged in a second region 306 of the substrate, the fifth bank array 350 and the seventh bank array 370 may be arranged in a third region 307 of the substrate, and the sixth bank array 360 and the eighth bank array 380 may be arranged in a fourth region 308 of the substrate. A person of ordinary skill in the art should understand and appreciate that arrangements illustrated in FIG. 21 are provided for illustrative purposes and the present disclosure is not limited to the structure as shown.

The first bank row decoder (or first row decoder) 260a and the first bank column decoder (or first column decoder) 270a may be disposed adjacent to the first bank array 310, the second bank row decoder 260b and the second bank column decoder 270b may be disposed adjacent to the second bank array 320, the third bank row decoder 260c and the third bank column decoder 270c may be disposed adjacent to the third bank array 330, and the eighth bank row decoder 260h and the eighth bank column decoder 270h may be disposed adjacent to the eighth bank array 380. The first through fourth regions 305-308 may correspond to a core region of the substrate.

The repair control circuit 400 and the timing control circuit 500 may be disposed in a peripheral region PERI of the substrate. Even though not illustrated, the control logic circuit 210, the address register 220, the column address latch 250, the data I/O buffer 295 in FIG. 4 may be disposed in the peripheral region PERI.

Figure 22:
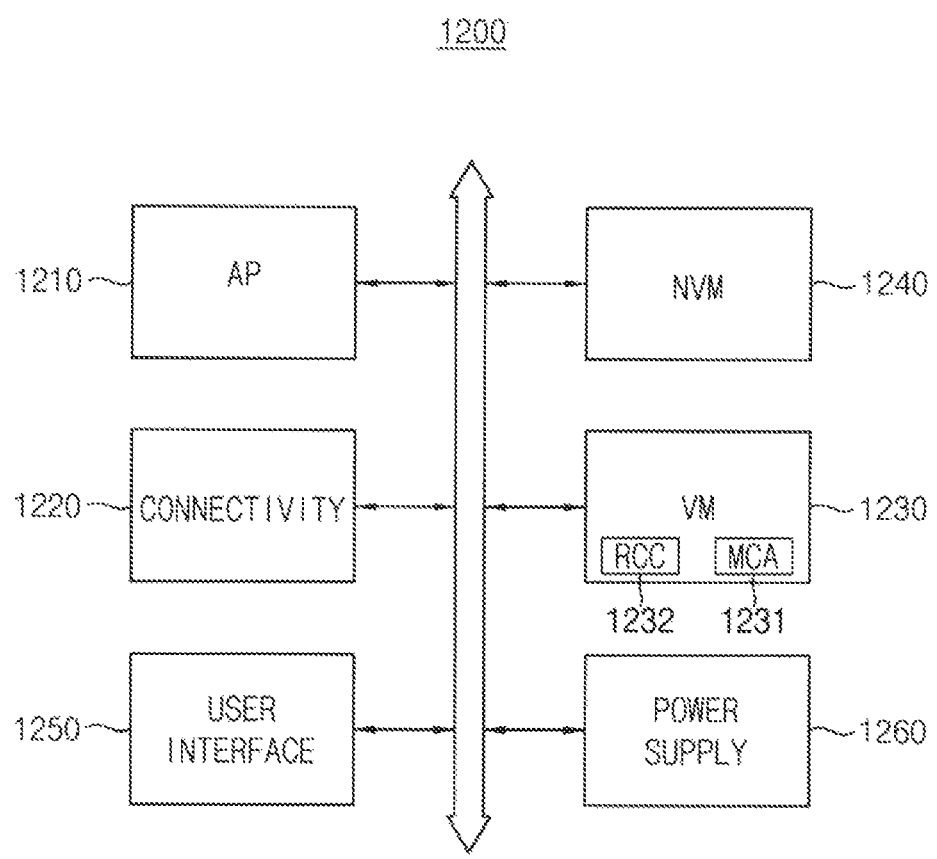
FIG. 22 is a block diagram illustrating a mobile system according to example embodiments.

FIG. 22 is a block diagram illustrating a mobile system according to example embodiments.

Referring to FIG. 21, a mobile system 1200 includes an application processor 1210, a connectivity circuit 1220, a volatile memory device (VM) 1230, a nonvolatile memory device (NVM) 1240, a user interface 1250, and a power supply 1260.

The application processor 1210 may execute computer instructions stored in computer-readable media (e.g., memory devices), including applications such as a web browser, a game application, a video player, etc. The connectivity circuit 1220 may perform wired or wireless communication with an external device. The volatile memory device 1230 may store data processed by the application processor 1210, or may operate as a working memory. For example, the volatile memory device 1230 may be a dynamic random access memory, such as double data rate synchronous dynamic random-access memory (DDR SDRAM), low power double data rate synchronous dynamic random-access memory (LPDDR SDRAM), graphics double data rate synchronous dynamic random-access memory (GDDR SDRAM), Rambus dynamic random-access memory (RDRAM), etc. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

The volatile memory device 1230 may include a memory cell array MCA 1231 having above-described structure and a repair control circuit RCC 1232 as described above.

As described above, the semiconductor memory device and/or the method of operating the semiconductor memory device according to example embodiments may reduce a size of the semiconductor memory device by grouping the normal cell region into the plurality of normal region groups to reduce the number of the comparators and the bit number of the fail addresses that are stored and compared. In addition, the semiconductor memory device and/or the method of operating the semiconductor memory device according to example embodiments may increase yield of the semiconductor memory device without increase of a size of the semiconductor memory device by dividing each normal region group into a plurality of the sub blocks and disposing the adjacent sub regions in the different normal region groups.

Example embodiments of the inventive concepts may be applied to any devices and systems including a memory device requiring a repair operation. For example, example embodiments of the inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

According to one or more example embodiments, the units and/or devices described above, such as the components of the control logic circuit and the repair control circuit and the sub-components thereof including the group selection circuit 420, address storage circuit 440 and comparison circuit 460 may be implemented using hardware, a combination of hardware and software, or a non-transitory storage medium storing software that is executable to perform the functions of the same. These components may be embodied in the same hardware platform or in separate hardware platforms.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media.

The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

The foregoing is illustrative of example embodiments and is not to be construed as limiting thereof. Although a few example embodiments have been described, those skilled in the art will readily appreciate that many modifications are possible in the example embodiments without materially departing from the example embodiments of the inventive concepts.

What is claimed is:

1. A semiconductor memory device comprising:
   a memory cell array including a normal cell region and a redundancy cell region, the normal cell region including a plurality of normal region groups, and the redundancy cell region configured to replace failed memory cells of the normal cell region; and
   a repair control circuit configured to,
      determine a target normal region group from among the plurality of normal region groups based on an input address,
      extract target fail addresses from among a plurality of fail addresses based on the target normal region group, the fail addresses each identifying a row or a column of the memory cell array, and
      control a repair operation based on the target fail addresses and the input address such that the repair operation is performed by unit of the row or by unit of the column, wherein
      the plurality of normal region groups includes $2^M$ normal region groups,
      a number of bits of the input address is N input bits,
      a number of bits of each of the plurality of fail addresses is N−M, and N is a natural number and M is a natural number smaller than N.

2. The semiconductor memory device of claim 1, wherein each of the plurality of normal region groups includes a plurality of sub regions such that ones of the plurality of sub regions adjacent to each other are in different ones of the plurality of normal region groups.

3. The semiconductor memory device of claim 2, wherein, in each of the plurality of normal region groups, the plurality of sub regions, are arranged sequentially in a column direction according to a round-robin scheme.

4. The semiconductor memory device of claim 1, wherein a number of bit of each of the plurality of the fail addresses usable to identify a row or a column of the memory cell array is smaller than the number of bits of the input address.

5. The semiconductor memory device of claim 1, wherein the input address includes one or more group identity bits representing the target normal region group.

6. The semiconductor memory device of claim 5, wherein the repair control circuit includes:
a group selection circuit configured to generate a plurality of group selection signals based on the group identity bits, the plurality of group selection signals representing the target normal region group;
an address storage circuit configured to store the plurality of fail addresses, and to extract the target fail addresses from among the plurality of fail addresses based on the plurality of group selection signals; and
a comparison circuit configured to generate a repair control signal based on the input address and the target fail addresses.

7. The semiconductor memory device of claim 6, wherein the comparison circuit is shared by the plurality of normal region groups.

8. The semiconductor memory device of claim 6, wherein the comparison circuit includes a plurality of comparators configured to compare the target fail addresses with the input address, and
wherein a number of the plurality of comparators is less than a number of the fail addresses storable in the address storage circuit.

9. The semiconductor memory device of claim 8, wherein, the number of the plurality of comparators is P and a number of the plurality of normal region groups is Q, and
the number of the fail addresses storable in the address storage circuit is P*Q, P and Q being natural numbers.

10. The semiconductor memory device of claim 8, wherein
the input address includes the one or more group identity bits and other bits,
each of the plurality of comparators includes a plurality of logic gates configured to perform a bitwise comparison of bits of ones of the target fail addresses with the other bits of the input address, and
a number of the plurality of logic gates in each comparator is N−M.

11. The semiconductor memory device of claim 2, wherein the input address includes one or more group identity bits and one or more sub region identity bits, the one or more group identity bits representing the target normal region group and the one or more sub region identity bits representing a target sub region among the plurality of sub regions.

12. The semiconductor memory device of claim 11, wherein the group identity bits in the input address are less significant bits than the sub region identity bits in the input address.

13. The semiconductor memory device of claim 2, wherein the semiconductor memory device is configured to perform a row repair operation to repair the failed memory cells by the unit of the row, such that each of the plurality of sub regions corresponds to a plurality of word lines.

14. The semiconductor memory device of claim 2, wherein the semiconductor memory device is configured to perform a column repair operation to repair the failed memory cells by the unit of the column in each of a plurality of memory blocks such that the plurality of sub regions corresponds to the plurality of memory blocks, and word lines of the redundancy cell region are different from word lines of the normal cell region.

15. The semiconductor memory device of claim 1, wherein the redundancy cell region includes a plurality of redundancy region groups, the plurality of the redundancy region groups configured replace the failed memory cells in corresponding normal region groups among the plurality of normal region groups.

16. The semiconductor memory device of claim 1, wherein the redundancy cell region is shared by the plurality of normal region groups such that the redundancy cell region is configured to replace the failed memory cells in the plurality of normal region groups.

17. A semiconductor memory device comprising:
a normal cell region including a plurality of normal region groups, each of the normal region groups including a plurality of sub regions, the plurality of sub regions included in respective ones of the normal region groups arranged one by one sequentially in a column direction according to a round-robin scheme;
a redundancy cell region configured to replace failed memory cells of the normal cell region; and
a repair control circuit configured to,
determine a target normal region group from among the plurality of normal region groups based on an input address,
extract target fail addresses from among a plurality of fail addresses based on the target normal region group, the fail addresses each identifying a row or a column, and
control a repair operation based on the target fail addresses and the input address such that the repair operation is performed by unit of the row or by unit of the column, wherein
the plurality of normal region groups includes 2^M normal region groups,
a number of bits of the input address is N input bits,
a number of bits of each of the plurality of fail addresses is N−M, and
N is a natural number and M is a natural number smaller than N.

18. A method of operating a semiconductor memory device, the semiconductor memory device including a normal cell region and a redundancy cell region, the normal cell region divided into a plurality of normal region groups, and the redundancy cell region configured to replace failed memory cells of the normal cell region, the method comprising:
determining a target normal region group from among the plurality of normal region groups based on an input address;

extracting target fail addresses from among a plurality of fail addresses based on the target normal region group, the fail addresses each identifying a row or a column; and controlling a repair operation based on the target fail addresses and the input address such that the repair operation is performed by unit of the row or by unit of the column, wherein the plurality of normal region groups includes $2^{\wedge}M$ normal region groups, a number of bits of the input address is N input bits, a number of bits of each of the plurality of fail addresses is N−M, and N is a natural number and M is a natural number smaller than N.

19. The method of claim 18, further comprising:

dividing each of the plurality of normal region groups into a plurality of sub regions; and arranging the sub regions included in the respective normal region groups one by one sequentially in a column direction according to a round-robin scheme.

* * * * *